United States Patent
Baek et al.

(10) Patent No.: US 11,424,312 B2
(45) Date of Patent: Aug. 23, 2022

(54) DISPLAY DEVICE

(71) Applicant: Samsung Display Co., Ltd., Yongin-si (KR)

(72) Inventors: Gyung Min Baek, Yongin-si (KR); Ju Hyun Lee, Seongnam-si (KR); Jae Uoon Kim, Hwaseong-si (KR); Hong Sick Park, Suwon-si (KR); Hyun Eok Shin, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 212 days.

(21) Appl. No.: 16/872,594

(22) Filed: May 12, 2020

(65) Prior Publication Data

US 2021/0091161 A1    Mar. 25, 2021

(30) Foreign Application Priority Data

Sep. 23, 2019   (KR) .................. 10-2019-0116542

(51) Int. Cl.
*H01L 27/32*   (2006.01)
*H01L 51/52*   (2006.01)

(52) U.S. Cl.
CPC ...... *H01L 27/3276* (2013.01); *H01L 27/3262* (2013.01); *H01L 27/3265* (2013.01); *H01L 51/5253* (2013.01); *H01L 2251/308* (2013.01)

(58) Field of Classification Search
CPC ............. H01L 27/3276; H01L 27/3262; H01L 27/3265; H01L 51/5253; H01L 2251/308
See application file for complete search history.

(56) References Cited

U.S. PATENT DOCUMENTS

| | | | | |
|---|---|---|---|---|
| 9,368,518 B2* | 6/2016 | Lee | ................... | H01L 29/66969 |
| 9,818,812 B2* | 11/2017 | Kim | ................... | H01L 27/3248 |
| 2013/0119392 A1* | 5/2013 | Park | ..................... | H01L 27/326 |
| | | | | 438/34 |
| 2014/0027726 A1* | 1/2014 | Choi | ................... | H01L 27/3211 |
| | | | | 438/34 |
| 2014/0353644 A1* | 12/2014 | You | ..................... | H01L 27/3258 |
| | | | | 257/40 |

(Continued)

FOREIGN PATENT DOCUMENTS

| KR | 10-2007-0119235 A | 12/2007 |
|---|---|---|
| KR | 10-2016-0081100 A | 7/2016 |
| KR | 10-2018-0076744 A | 7/2018 |

*Primary Examiner* — Shaun M Campbell
(74) *Attorney, Agent, or Firm* — Lewis Roca Rothgerber Christie LLP

(57) ABSTRACT

A device includes a substrate including a display area and a pad area; a first conductive layer on the substrate; and a first insulating film on the first conductive layer, the first insulating film having a first contact hole in the display area to expose the first conductive layer and a pad opening exposing the first conductive layer in the pad area, the first conductive layer being arranged such that in a first region covered by the first insulating film, a second conductive capping layer of the first conductive layer is entirely on a first conductive capping layer of the first conductive layer; in a second region overlapping the contact hole, the second conductive capping layer is entirely on the first conductive capping layer; and in a third region exposed by the pad opening, the second conductive capping layer exposes at least a portion of the first conductive capping layer.

20 Claims, 24 Drawing Sheets

(56) References Cited

U.S. PATENT DOCUMENTS

| | | | |
|---|---|---|---|
| 2016/0141544 A1* | 5/2016 | You | H01L 51/5218 |
| | | | 438/23 |
| 2016/0190454 A1* | 6/2016 | You | H01L 51/56 |
| | | | 257/40 |
| 2016/0204175 A1* | 7/2016 | Kim | H01L 27/3262 |
| | | | 438/42 |
| 2016/0211310 A1* | 7/2016 | Wang | H01L 51/5284 |
| 2018/0075805 A1* | 3/2018 | Kim | G09G 3/3233 |
| 2018/0151633 A1* | 5/2018 | Won | H01L 27/3276 |

\* cited by examiner

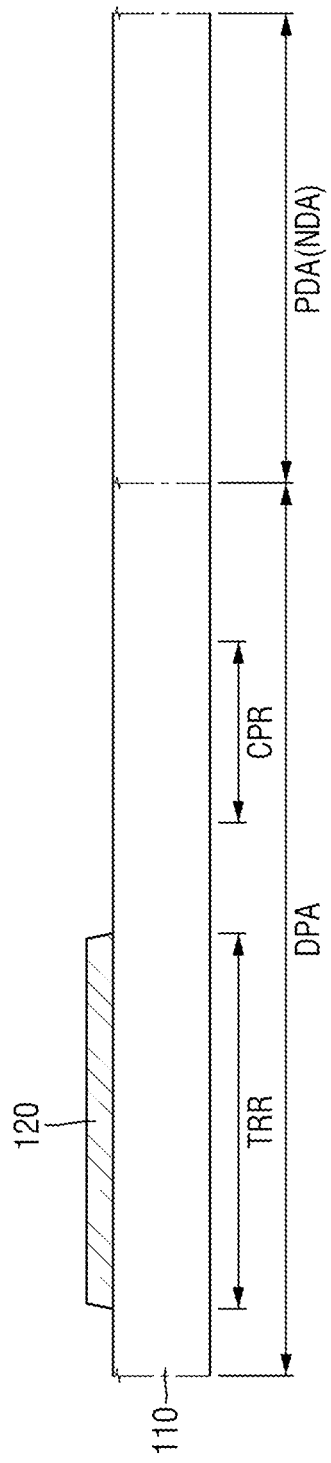

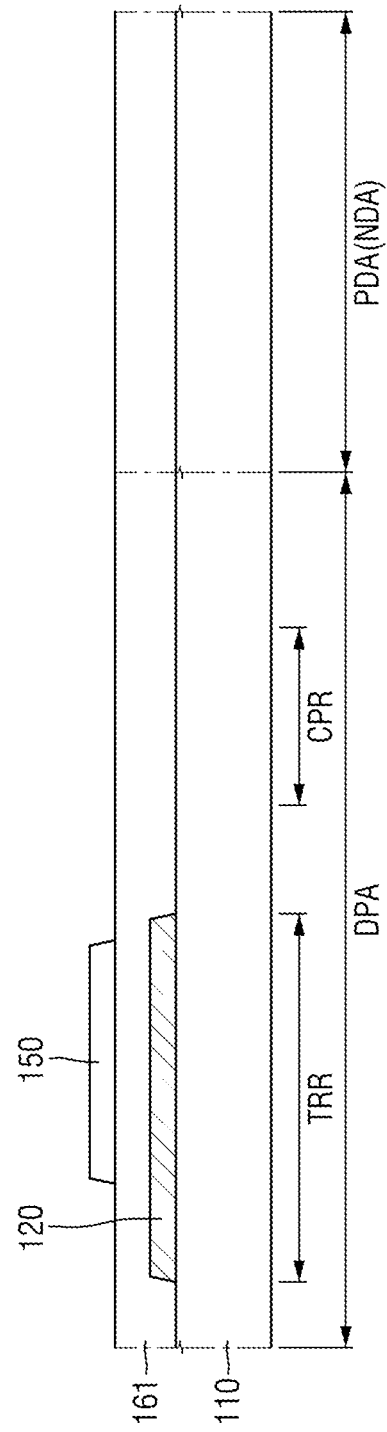

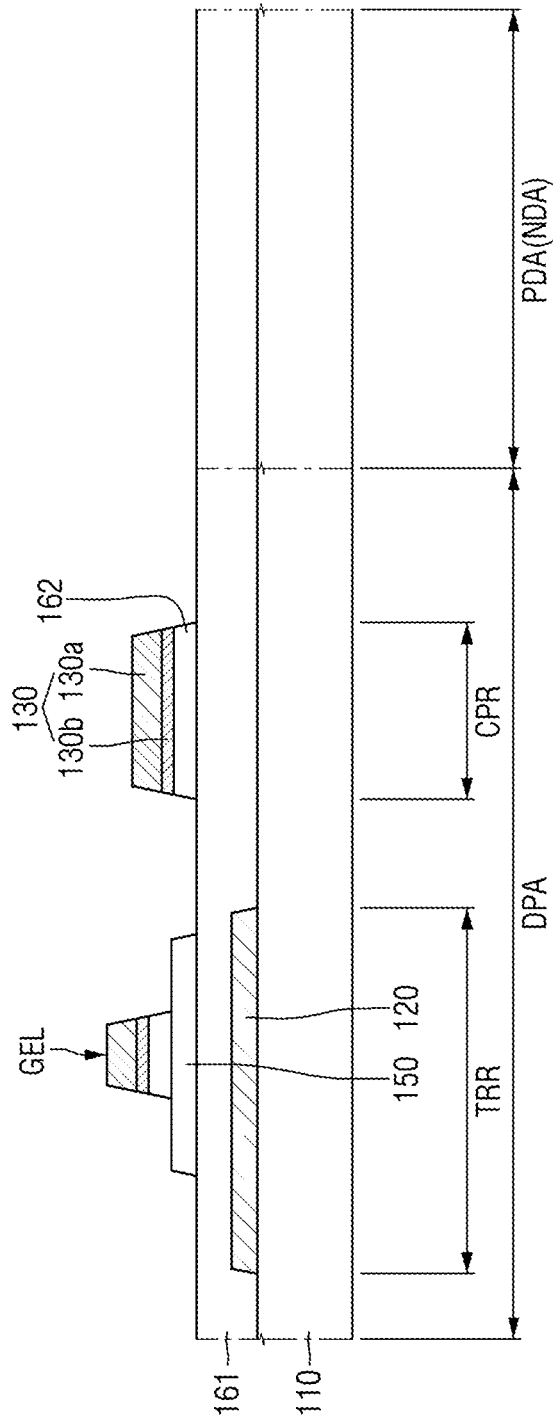

DISPLAY DEVICE

CROSS-REFERENCE TO RELATED APPLICATION

This application claims priority to and the benefit of Korean Patent Application No. 10-2019-0116542, filed on Sep. 23, 2019, the entire disclosure of which is incorporated herein by reference.

BACKGROUND

1. Field

Embodiments of the present disclosure relate to a display device and a method of manufacturing a display device.

2. Description of the Related Art

Electronic appliances such as televisions, smart phones, tablet PCs, digital cameras, notebook computers, and navigators, which provide images, include display devices for displaying images.

A display device may include a plurality of pixels and a pixel circuit for driving each pixel. Each pixel circuit includes wirings and thin film transistors on an insulating substrate. An end of each of the wirings is provided with a wiring pad, and an external device is mounted on the wiring pad.

Such a display device may be formed through a plurality of mask processes. The mask processes may be used for patterning wirings, insulating films, and/or the like, but process efficiency (e.g., the efficiency of an entire manufacturing process) may decrease as the mask processes are added one by one. Further, chemical materials may be used in the mask process, and the chemical materials, which are reactive materials, may have different etching selectivities depending on the material included in a conductive layer. When the etching selectivities of laminated conductive layers are different, during the mask process, tips protruding from the surface of an overlying conductive layer (e.g., a top conductive layer of the laminated conductive layers) may occur. When the tips of the overlying conductive layer occur, cracks may occur in a passivation layer.

SUMMARY

Aspects of embodiments of the present disclosure provide a display device including a data conductive layer having high reliability.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes a substrate including a display area and a pad area; a first conductive layer on the substrate; a first insulating film on the first conductive layer; and a second conductive layer on the first insulating film, the first conductive layer including a base layer, a main metal layer on the base layer and including copper, a first conductive capping layer on the main metal layer, and a second conductive capping layer on the first conductive capping layer, the first insulating film having a first contact hole in the display area and penetrating through the first insulating film in a thickness direction to expose the first conductive layer and a pad opening exposing the first conductive layer in the pad area, the first conductive layer being arranged such that: in a first region covered by the first insulating film, the second conductive capping layer is entirely on the first conductive capping layer; in a second region overlapping the first contact hole, the second conductive capping layer is entirely on the first conductive capping layer; and in a third region exposed by the pad opening, the second conductive capping layer exposes at least a portion of the first conductive capping layer.

In an exemplary embodiment, the second conductive capping layer includes Cu or ZIO.

In an exemplary embodiment, the first conductive capping layer includes a different material from the main metal layer.

In an exemplary embodiment, the first conductive capping layer includes Ti.

In an exemplary embodiment, the base layer and the first conductive capping layer include the same material.

In an exemplary embodiment, side surfaces of the base layer, the main metal layer, the first conductive capping layer, and the second conductive capping layer of the first conductive layer are aligned in parallel with each other.

In an exemplary embodiment, the display device includes a third conductive layer on the substrate and under the first conductive layer in the first region; and a second insulating film between the third conductive layer and the first conductive layer.

In an exemplary embodiment, the second insulating film includes a second contact hole in the display area and penetrating through the second insulating film in the thickness direction to expose the third conductive layer.

In an exemplary embodiment, the first conductive layer in the first region is connected to the third conductive layer through the second contact hole included in the second insulating film.

In an exemplary embodiment, the second conductive capping layer includes the same material as the main metal layer.

In an exemplary embodiment, the first conductive capping layer and the base layer include the same material.

In an exemplary embodiment, the first conductive capping layer and the base layer include Ti.

In an exemplary embodiment, the first conductive layer is connected to the second conductive layer through the first contact hole in the second region.

In an exemplary embodiment, the first conductive capping layer of the first conductive layer is exposed by the pad opening in the third region.

In an exemplary embodiment, the second conductive capping layer of the first conductive layer does not overlap the pad opening in the thickness direction in the third region.

According to an embodiment of the present disclosure, a display device includes a substrate including a display area and a pad area; a first conductive layer on the substrate; a first insulating film on the first conductive layer; and a second conductive layer on the first insulating film, the first conductive layer including a base layer, a main metal layer on the base layer, a first conductive capping layer on the main metal layer, and a second conductive capping layer on the first conductive capping layer, the first insulating film having a first contact hole in the display area and penetrating through the first insulating film in a thickness direction to expose the first conductive layer and a pad opening exposing the first conductive layer in the pad area, the first conductive layer includes a first region overlapping the contact hole, a second region covered by the first insulating film, and a third region exposed by the pad opening, and the first region of the first conductive layer and the second region of the first conductive layer overlapping the display area, and the third region of the first conductive layer overlapping the pad area.

In an exemplary embodiment, the main metal layer and the second conductive capping layer include the same material, and the base layer and the first conductive capping layer include the same material.

In an exemplary embodiment, the main metal layer and the first conductive capping layer include different materials.

In an exemplary embodiment, in the third region of the first conductive layer, the first conductive capping layer is exposed in the thickness direction by the second conductive capping layer, and the first conductive capping layer exposed by the second conductive capping layer overlaps the pad opening in the thickness direction.

In an exemplary embodiment, the second conductive layer is connected to the second region of the first conductive layer through the first contact hole.

According to the display device of an embodiment, side surfaces of the conductive layer may be aligned in parallel to suppress the occurrence of cracks in the passivation layer.

Further, according to the display device of an embodiment, the direct contact of the conductive layer constituting the wiring pad with reactive materials may be suppressed to improve reliability.

Although some embodiments of the present disclosure have been disclosed for illustrative purposes, those skilled in the art will appreciate that various modifications, additions and/or substitutions are possible, without departing from the scope and spirit of the present disclosure as disclosed in the accompanying claims and equivalents thereto.

BRIEF DESCRIPTION OF THE DRAWINGS

The above and other aspects and features of the present disclosure will become more apparent by describing in more detail exemplary embodiments thereof with reference to the attached drawings, in which:

FIGS. 6 to 15 are cross-sectional views illustrating process steps of a method of manufacturing the display device of FIG. 5 according to an embodiment;

DETAILED DESCRIPTION

Some embodiments of the present disclosure will now be described more fully hereinafter with reference to the accompanying drawings, in which some embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or one or more intervening layers may be interposed therebetween. The same reference numbers indicate the same components throughout the specification. As used herein, the term "and/or" includes any and all combinations of one or more of the associated listed items. As used herein, terms in the singular form are intended to include the plural forms as well, unless the context clearly indicates otherwise.

It will be understood that, although terms such as "first," "second," etc. may be used herein to describe various elements, these elements should not be limited by these terms. These terms are used to distinguish one element from another element(s). For instance, a first element discussed below could be termed a second element without departing from the teachings of the present disclosure. Similarly, a second element could also be termed a first element without departing from the teachings of the present disclosure.

Hereinafter, some embodiments of the present disclosure will be described with reference to the attached drawings.

Figure 1:
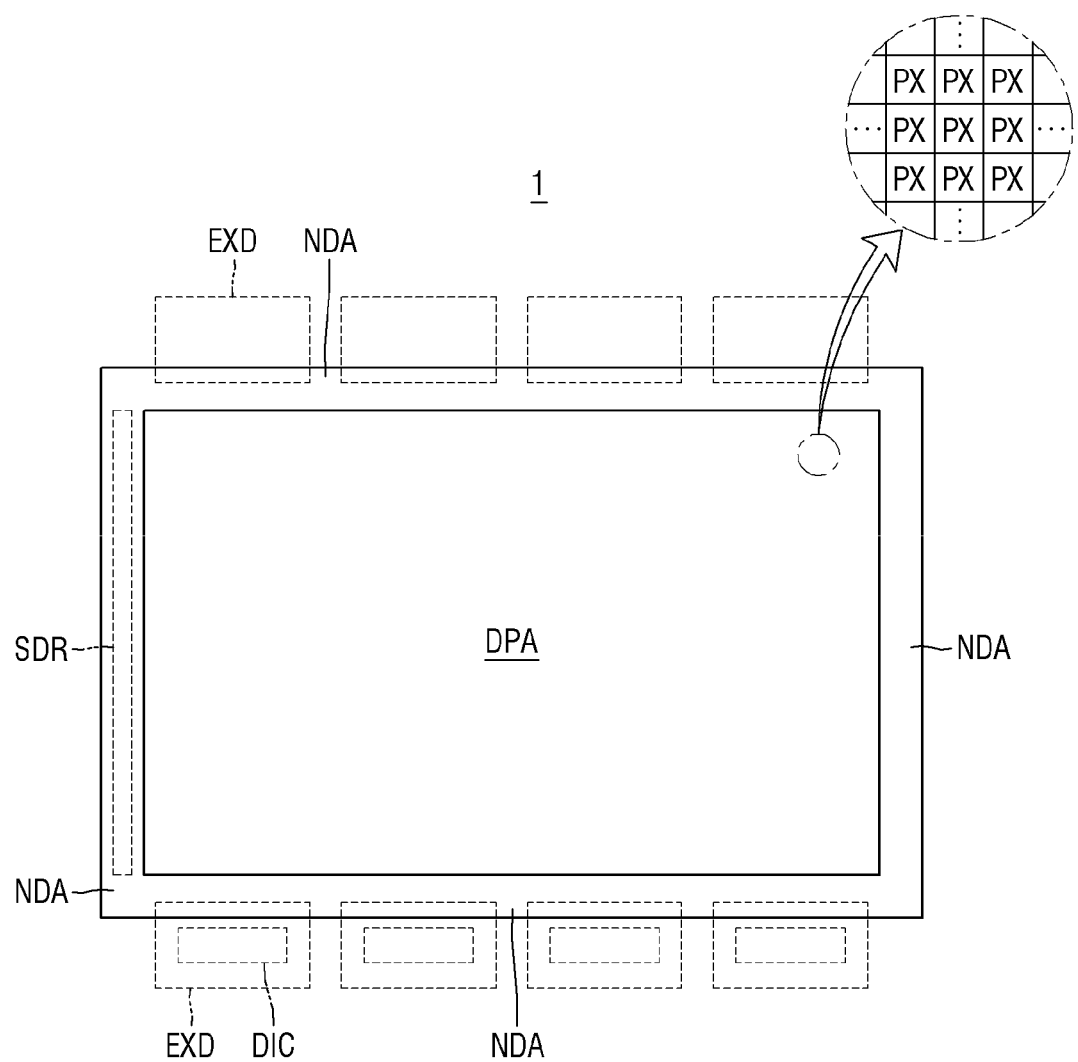
FIG. 1 is a plan view of a display device according to an embodiment.

FIG. 1 is a plan view of a display device according to an embodiment.

A display device 1 may refer to any suitable electronic device that provides a display screen. Examples of the display device 1 may include televisions, notebook computers, monitors, billboards, mobile phones, smart phones, tablet personal computers (tablet PCs), electronic watches, smart watches, watch phones, mobile communication terminals, electronic notebooks, electronic books, portable multimedia players (PMPs), navigators, game machines, digital cameras, and the internet of things (IoTs).

The display device 1 may be classified in various ways according to a display method. For example, the display device 1 may be classified into an organic light emitting display (OLED), an inorganic light emitting display (inorganic EL), a quantum dot light emitting display (QED), a micro LED display (micro-LED), a nano LED display (nano-LED), a plasma display panel (PDP), a field emission display device (FED), a cathode ray display device (CRT), a liquid crystal display (LCD), or an electrophoretic display device (EPD). Hereinafter, an embodiment where an organic light emitting display device is used as the display device will be described as an example, and the organic light emitting display device applied to embodiments will be simply referred to as the display device 1 unless another classification is referred to. However, embodiments are not limited to the organic light emitting display device, and other suitable display devices, such as those listed above or generally available in the art, may be applied within the scope of the present disclosure.

The display device 1 may have a rectangular shape in a plan view (for example, when seen in a plan view). When the display device 1 is a television, long sides are generally oriented in the horizontal direction. However, the present disclosure is not limited thereto. The long sides may be oriented in the vertical direction, and may also be variably in the horizontal or vertical direction to be rotatable.

The display device 1 may include a display area DPA and a non-display area NDA. The display area DPA is an active area where an image is displayed. In some embodiments, the display area DPA may have a similar shape as the overall display device 1. For example, when the display device 1 is rectangular in a plan view, the display area DPA may also be rectangular in a plan view.

The display area DPA may include a plurality of pixels PX. The plurality of pixels PX may be arranged in a matrix direction (e.g., in a matrix pattern). The shape of each pixel PX may be rectangular or square in a plan view, but is not limited thereto. For example, each pixel PX may have a rhombus shape, each side thereof being inclined with respect to a direction of one side of the display device 1. The plurality of pixels PX may include various color pixels PX. For example, the plurality of pixels PX may include, but are not limited to, a red first color pixel PX, a green second color pixel PX, and a blue third color pixel PX. The color pixels PX may be alternately arranged in a stripe type or kind (e.g., a stripe pattern) or in a pentile type or kind (e.g., a pentile pattern).

The non-display area NDA may be around the display area DPA. The non-display area NDA may entirely or partially surround the display area DPA. The display area DPA may have a rectangular shape, and the non-display area NDA may be adjacent to the four sides of the display area DPA. The non-display area NDA may constitute a bezel of the display device 1.

A driving circuit or a driving element for driving the display area DPA may be in the non-display area NDA. According to an embodiment, in a first non-display area NDA (e.g., a first portion, such as a bottom side, of the non-display area NDA) adjacent to a first long side (e.g., a bottom side, as shown in FIG. 1) and a second non-display area NDA (e.g., a second portion, such as a top side, of the non-display area NDA) adjacent to a second long side (e.g., a top side, as shown in FIG. 1) of the display device 1, a pad unit may be provided on a display substrate of the display device 1, and an external device EXD may be mounted on a pad electrode of the pad unit. Examples of the external device EXD may include a connection film, a printed circuit board, a driving chip (DIC), a connector, and a wiring connection film. In a third non-display area NDA (e.g., a third portion, such as a left side, of the non-display area NDA) adjacent to a first short side (e.g., a left side, as shown in in FIG. 1) of the display device 1, a scan driver SDR may be directly on the display substrate of the display device 1.

Figure 2:
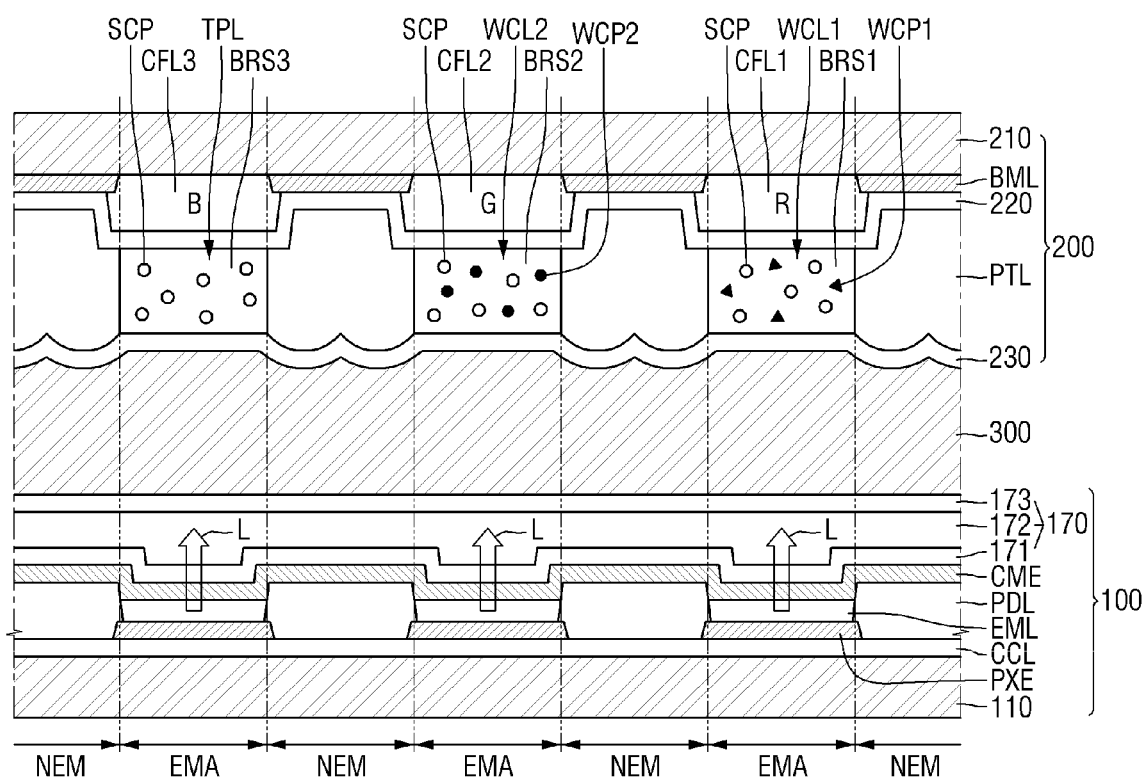
FIG. 2 is a cross-sectional view of a display device according to an embodiment.

FIG. 2 is a cross-sectional view of a display device according to an embodiment.

FIG. 2 illustrates a front emission type or kind display device in which light L is emitted from a light emitting layer EML in a direction toward a second substrate 210 and not in a direction toward a first substrate 110, but the display device 1 is not limited thereto.

Referring to FIG. 2, the display device 1 may include the light emitting layer EML, an encapsulation structure 170 covering the light emitting layer EML, and color control structures WCL, TPL, and CFL on the encapsulation structure 170. In an embodiment, the display device 1 may include a first display substrate 100 and a second display substrate 200 facing the first display substrate 100. The light emitting layer EML, the encapsulation structure 170, and the color control structures WCL, TPL, and CFL may be included in any one selected from the first display substrate 100 and the second display substrate 200.

For example, the first display substrate 100 may include a first substrate 110, a light emitting layer EML on one surface of the first substrate 110, and an encapsulation structure 170 on the light emitting layer EML. In some embodiments, the second display substrate 200 may include a second substrate 210 and color control structures WCL, TPL, and CFL on one surface of the second substrate 210 facing the first substrate 110. The color control structure may include a color filter layer CFL and a wavelength conversion layer WCL. The color control structure may further include a light transmitting layer TPL at the same level (e.g., on the same layer) as the wavelength conversion layer WCL in some pixels.

A filling layer 300 may be between the encapsulation structure 170 and the color control structures WCL, TPL, and CFL. The filling layer 300 may fill a space between the first display substrate 100 and the second display substrate 200 and couple them together.

The first substrate 110 of the first display substrate 100 may be an insulating substrate. The first substrate 110 may include a transparent material. For example, the first substrate 110 may include a transparent insulating material such as glass and/or quartz. The first substrate 110 may be a rigid substrate. However, the first substrate 110 is not limited thereto. The first substrate 110 may include a plastic such as polyimide and may have flexible properties capable of warping, bending, folding, and/or rolling.

A plurality of pixel electrodes PXE may be on one surface of the first substrate 110. The plurality of pixel electrodes PXE may be for each pixel PX (e.g., each corresponding pixel PX). The pixel electrodes PXE of the neighboring (e.g., adjacent) pixels PX may be separated from each other. A circuit layer CCL for driving the pixels PX may be on the first substrate 110. The circuit layer CCL may be between the first substrate 110 and the pixel electrodes PXE. The circuit layer CCL will be described in more detail herein below.

The pixel electrode PXE may be a first electrode of a light emitting diode, for example, an anode electrode. The pixel electrode PXE may have a laminated film structure in which a high-work-function material layer including indium-tin-oxide (ITO), indium-zinc-oxide (IZO), zinc oxide (ZnO), and/or indium oxide ($In_2O_3$), and a reflective material layer including silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and/or a mixture thereof, are laminated. The high-work-function material layer may be over the reflective material layer, and thus may be closer to the light emitting layer EML. The pixel electrode PXE may have a multilayer structure of ITO/Mg, ITO/MgF, ITO/Ag, or ITO/Ag/ITO, but the structure thereof is not limited thereto.

The pixel defining layer PDL may be on one surface (e.g., an upper surface) of the first substrate 110 along a boundary of the pixel PX (e.g., at a boundary of the pixels PX). The pixel defining layer PDL may be on the pixel electrode PXE, and may include an opening exposing the pixel electrode PXE. For example, in some embodiments the pixel defining layer PDL may be on a first portion of the pixel electrode PXE and may include an opening exposing a second portion of the pixel electrode PXE). A light emitting area EMA and a non-light emitting area NEM may be divided by the pixel defining layer PDL and the opening thereof, respectively. For example, the light emitting areas EMA may be separated by the pixel defining layer PDL, and the non-light emitting areas NEM may be separated by the openings in the pixel defining layer PDL. The pixel defining layer PDL may include an organic insulating material such as a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB). The pixel defining layer PDL may include an inorganic material.

The light emitting layer EML is on the pixel electrode PXE (e.g., on the portion of the pixel electrode PXE) exposed by the pixel defining layer PDL. In an embodiment where the display device 1 is an organic light emitting display device, the light emitting layer EML may include an organic layer including an organic material. The organic layer may include an organic light emitting layer, and in some cases, may further include a hole injection/transport layer(s) and/or an electron injection/transport layer(s) as an auxiliary layer(s) that assists light emission. In some embodiments where the display device is a micro LED display device, a nano LED display device, or the like, the light emitting layer EML may include an inorganic material such as an inorganic semiconductor.

In some embodiments, the light emitting layer EML may have a tandem structure including a plurality of organic light emitting layers overlapping each other in a thickness direction and a charge generation layer therebetween. As used herein, a thickness direction may refer to a direction that is perpendicular to a plane of the first substrate 100 and extends from the first display substrate 100 to the second display substrate 200. The organic light emitting layers overlapping each other may emit light of the same (e.g., substantially the same) wavelength, but are not limited thereto, and in some embodiments, they may emit light of different wavelengths. At least a portion of the emission layer EML of each pixel PX may be separated from the same layer (e.g., the emission layer EML) of the neighboring (e.g., adjacent) pixels PX.

In an embodiment, the wavelength of light emitted from each light emitting layer EML may be the same for each color pixel PX. For example, the light emitting layer EML of each color pixel PX may emit blue light or ultraviolet light, and the color control structure may include the wavelength conversion layer WCL, thereby displaying a color for each pixel PX.

In some embodiments, the wavelength of light emitted from each light emitting layer EML may be different for each color pixel PX. For example, the light emitting layer EML of the first color pixel PX may emit light of a first color, the light emitting layer EML of the second color pixel PX may emit light of a second color, and the light emitting layer EML of the third color pixel PX may emit light of a third color.

A common electrode CME may be on the light emitting layer EML. The common electrode CME may be in contact (e.g., physical contact or direct contact) with not only the light emitting layer EML but also the upper surface of the pixel defining layer PDL.

The common electrode CME may be connected without distinguishing the pixels PX. For example, the common electrode CME may be commonly connected to the pixels PX. The common electrode CME may be a front (e.g., upper) electrode over the entire surface of the light emitting layer EML without distinguishing the pixels PX. The common electrode CME may be a second electrode of the light emitting diode, for example, a cathode electrode.

The common electrode CME may include a material layer having a low work function, including Li, Ca, LiF/Ca, LiF/Al, Al, Mg, Ag, Pt, Pd, Ni, Au, Nd, Ir, Cr, BaF, Ba, a compound thereof, and/or a mixture thereof (for example, a mixture of Ag and Mg). The common electrode CME may further include a transparent metal oxide layer on the low-work-function material layer.

The pixel electrode PXE, the light emitting layer EML, and the common electrode CME may constitute a light emitting element (for example, an organic light emitting element). The light emitted from the light emitting layer EML may be emitted upward through the common electrode CME.

The encapsulation structure 170 may be on the common electrode CME. In some embodiments, the encapsulation structure 170 may be a thin film encapsulation structure. In some embodiments, the encapsulation structure 170 may include at least one thin film encapsulation layer. For example, the thin film encapsulation layer may include a first inorganic film 171, an organic film 172, and a second inorganic film 173. Each of the first inorganic film 171 and the second inorganic film 173 may include silicon nitride, silicon oxide, and/or silicon oxynitride. The organic film 172 may include an organic insulating material such as a polyacrylate resin, an epoxy resin, a phenolic resins, a polyamide resin, a polyimide resin, an unsaturated polyester resin, a polyphenylene ether resin, a polyphenylene sulfide resin, and/or benzocyclobutene (BCB).

The second display substrate 200 may be over the encapsulation structure 170 so as to face the encapsulation structure 170. The second substrate 210 of the second display substrate 200 may include a transparent material. The second substrate 210 may include a transparent insulating material such as glass and/or quartz. The second substrate 210 may be a rigid substrate. However, the second substrate 210 is not limited thereto. The second substrate 210 may include a plastic such as polyimide and may have flexible properties capable of warping, bending, folding, and/or rolling.

The second substrate 210 may be the same substrate (e.g., may have a same or substantially the same structure) as the first substrate 110, but is not limited thereto, and in some embodiments the second substrate 210 may have different materials, thicknesses, transmittances, and/or the like from the first substrate 110. For example, the second substrate 210 may have higher transmittance than the first substrate 110. The second substrate 210 may be thicker or thinner than the first substrate 110.

A light blocking member BML may be on one surface (e.g., a lower surface) of the second substrate 210 facing the first substrate 110 along the boundary (e.g., correspond to the boundary) of the pixel PX. The light blocking member BML may overlap the pixel defining layer PDL of the first display substrate 100 and may be located in the non-light emitting area NEM. The light blocking member BML may include an opening exposing one surface (e.g., a portion of the lower surface) of the second substrate 210 overlapping the light emitting area EMA. The light blocking member BML may have a grid shape in a plan view.

The light blocking member BML may include an organic material. The light blocking member BML may reduce color distortion due to external light reflection by absorbing external light. In some embodiments, the light blocking member BML may serve to prevent or reduce the invasion (e.g., penetration or permeation) of the light emitted from the light emitting layer EML into the adjacent pixel PX.

In an embodiment, the light blocking member BML may absorb light of all visible wavelengths. The light blocking member BML may include a light absorbing material. For example, the light blocking member BML may include a material to be used as a black matrix of the display device 1.

In some embodiments, the light blocking member BML may absorb light of a wavelength (e.g., a range of wavelengths) from among the visible wavelengths and may transmit light of another wavelength (e.g., another range of wavelengths) from among the visible wavelengths. For example, the light blocking member BML may include the same material as the color filter layer CFL. For example, the light blocking member BML may include the same material as a blue color filter layer (e.g., a third color filter CFL3). In some embodiments, the light blocking member BML may be integrated with the blue color filter layer.

The light blocking member BML may be omitted.

The color filter layer CFL may be on one surface (e.g., the lower surface) of the second substrate 210 on which the light blocking member BML is located. The color filter layer CFL may be on one surface (e.g., a portion of the lower surface) of the second substrate 210 exposed through the opening of the light blocking member BML. Moreover, the color filter layer CFL may be on a portion of the adjacent light blocking member BML.

The color filter layer CFL may include a first color filter layer CFL1 on the first color pixel PX, a second color filter layer CFL2 on the second color pixel PX, and a third color filter layer CFL3 on the third color pixel PX. Each color filter layer CFL may include a colorant such as a dye and/or a pigment that absorbs light of wavelengths other than the corresponding color wavelengths. The first color filter layer CFL1 may be a red color filter layer, the second color filter layer CFL2 may be a green color filter layer, and the third color filter layer CFL3 may be a blue color filter layer. Although it is shown in the drawings that the neighboring color filter layers CFL are spaced apart from each other on the light blocking member BML, the neighboring color filter layers CFL may at least partially overlap each other on the light blocking member BML.

A first capping layer 220 may be on the color filter layer CFL. The first capping layer 220 may prevent or reduce the occurrence of impurities, such as moisture and/or air, from permeating (e.g., permeating through, or penetrating into, the color filter layer CFL) from the outside to damage and/or contaminate the color filter layer CFL. In addition, the first capping layer 220 may prevent or reduce the diffusion of the color material of the color filter layer CFL into another component.

The first capping layer 220 may be in direct contact with one surface (e.g., a lower surface, as shown in FIG. 2) of the color filter layer CFL. The first capping layer 220 may include an inorganic material. For example, the first capping layer 220 may include silicon nitride, aluminum nitride, zirconium nitride, titanium nitride, hafnium nitride, tantalum nitride, silicon oxide, aluminum oxide, titanium oxide, tin oxide, and/or silicon oxynitride.

A partition wall PTL may be on the first capping layer 220. The partition wall PTL may be located in the non-light emitting area NEM. The partition wall PTL may overlap the light blocking member BML. The partition wall PTL may include an opening exposing the color filter layer CFL. In some embodiments where the first capping layer 220 is included on the color filter layer CFL, the opening of the partition wall PTL may expose the first capping layer 220. The partition wall PTL may include, but is not limited to, a photosensitive organic material. The partition wall PTL may further include a light blocking material.

A wavelength conversion layer WCL and/or a light transmitting layer TPL may be in a space exposed by the opening of the partition wall PTL. The wavelength conversion layer WCL and the light transmitting layer TPL may be formed by an inkjet process using the partition wall PTL as a bank (e.g., as a well), but the present disclosure is not limited thereto.

In an embodiment where the light emitting layer EML of each pixel PX emits light of a third color (e.g., a blue color), the wavelength conversion layer WCL may include a first wavelength conversion pattern WCL1 in the first color pixel PX and a second wavelength conversion pattern WCL2 in the second color pixel PX. The light transmitting layer TPL may be in the third color pixel PX.

The first wavelength conversion pattern WCL1 may include a first base resin BRS1 and a first wavelength conversion material WCP1 in the first base resin BRS1. The second wavelength conversion pattern WCL2 may include a second base resin BRS2 and a second wavelength conversion material WCP2 in the second base resin BRS2. The light transmitting layer TPL may include a third base resin BRS3 and scatterers SCP therein.

The first to third base resins BRS1, BRS2, and BRS3 may include a transparent organic material. For example, the first to third base resins BRS1, BRS2, and BRS3 may include an epoxy resin, an acrylic resin, a cardo resin, and/or an imide resin. The first to third base resins BRS1, BRS2, and BRS3 may include the same material, but the material thereof is not limited thereto.

The scatterers SCP may include metal oxide particles and/or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and/or tin oxide ($SnO_2$). Examples of the material of the organic particles may include acrylic resins and/or urethane resins.

The first wavelength conversion material WCP1 may convert light of a third color (e.g., blue) into light of a first color (e.g., red), and the second wavelength conversion material WCP2 may convert light of a third color (e.g., blue) into light of a second color (e.g., green). The first wavelength conversion material WCP1 and the second wavelength conversion material WCP2 may be quantum dots, quantum bars, phosphors, and/or the like. The quantum dots may include group IV nanocrystals, group II-VI compound nanocrystals, group III-V compound nanocrystals, group IV-VI compound nanocrystals, and/or combinations thereof. The first wavelength conversion pattern WCL1 and the second wavelength conversion pattern WCL2 may further include scatterers SCP for increasing wavelength conversion efficiency.

The light transmitting layer TPL in the third color pixel PX transmits the light of the third color incident on (e.g., emitted from) the light emitting layer EML while maintaining the wavelength thereof. The scatterers SCP of the light transmitting layer TPL may serve to control the emission path of light emitted through (e.g., transmitted through) the light transmitting layer TPL. The light transmitting layer TPL may not include a wavelength conversion material.

A second capping layer 230 is on the wavelength conversion layer WCL and the light transmitting layer TPL. In some embodiments, the second capping layer 230 may be on the partition wall PTL. The second capping layer 230 may include an inorganic material. The second capping layer 230 may include a material selected from the materials that may be included in the first capping layer 220. The second capping layer 230 and the first capping layer 220 may include the same material, but the materials thereof are not limited thereto.

A filling layer 300 may be between the first display substrate 100 and the second display substrate 200. The filling layer 300 may fill a space between the first display substrate 100 and the second display substrate 200, and may couple them together. The filling layer 300 may be between the encapsulation structure 170 of the first display substrate 100 and the second capping layer 230 of the second display substrate 200. The filling layer 300 may include an Si-based organic material, an epoxy-based organic material, and/or the like, but the material thereof is not limited thereto.

Hereinafter, the circuit layer CCL of the display device 1 will be described in more detail.

Figure 3:
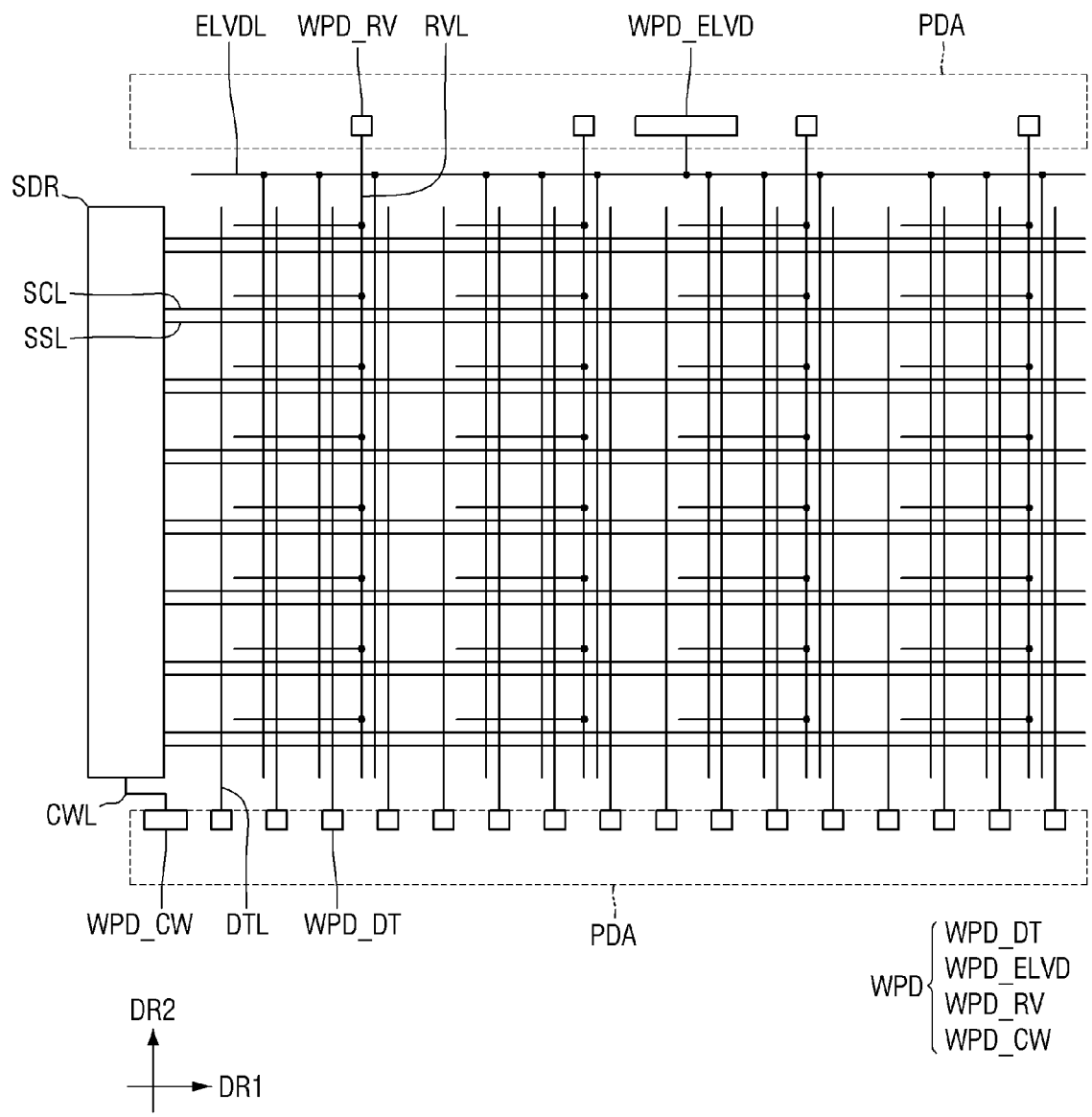
FIG. 3 is a schematic layout view of a circuit layer of a first display substrate of a display device according to an embodiment.

FIG. 3 is a schematic layout view of a circuit layer of a first display substrate of a display device according to an exemplary embodiment.

Referring to FIG. 3, a plurality of wirings are arranged on the first substrate 110. The plurality of wirings may include a scan line SCL, a sensing signal line SSL, a data line DTL, a reference voltage line RVL, and/or a first power supply line ELVDL.

The scan line SCL and the sensing signal line SSL may extend in a first direction DR1. The scan line SCL and the sensing signal line SSL may be connected to a scan driver SDR. The scan driver SDR may include a driving circuit formed of a circuit layer CCL. For example, the scan driver SDR may be connected to the circuit layer CCL. The scan driver SDR may be in the third non-display area NDA (e.g., a left side of the non-display area NDA) on the first substrate 110, but the present disclosure is not limited thereto. For example, the scan driver SDR may be in the fourth non-display area NDA (e.g., a right side of the non-display area NDA) or in both the third non-display area NDA and the fourth non-display area NDA. The scan driver SDR may be connected to a signal connection wiring CWL, and at least one end of the signal connection wiring CWL may form (e.g., may constitute or may be connected to) a signal connection wiring pad WPD_CW in the first non-display area NDA (e.g., a bottom side of the non-display area NDA) and/or the second non-display area NDA (e.g., a top side of the non-display area NDA) to be connected to an external device (EXD, as shown in FIG. 1).

The data line DTL and the reference voltage line RVL may extend in a second direction DR2 crossing (e.g., perpendicularly or substantially perpendicularly crossing) the first direction DR1. The first power supply line ELVDL may include a portion extending in the second direction DR2. The first power supply line ELVDL may further include a portion extending in the first direction DR1. The first power supply line ELVDL may have a mesh structure (e.g., a mesh shape), but the structure (e.g., shape) thereof is not limited thereto.

A wiring pad WPD may beat least one end of the data line DTL, the reference voltage line RVL, and the first power supply line ELVDL. In some embodiments, the wiring pad WPD may be at least one end of the signal connection wiring CWL. In some embodiments, the wiring pad WPD may include a data pad WPD_DT, a reference voltage pad WPD_RV, a first power supply pad WPD_ELVD, and a signal connection wiring pad WPD_CW. Each wiring pad WPD may be in the non-display area NDA. In an embodiment, the data pad WPD_DT of the data line DTL may be in the first non-display area NDA, and the reference voltage pad WPD_RV of the reference voltage line RVL and the first power supply pad WPD_ELVD of the first power supply line ELVDL may be in the second non-display area NDA. In some embodiments, the data pad WPD_DT, the reference voltage pad WPD_RV, and the first power supply pad WPD_ELVD may all be in the same area, for example, the first non-display area NDA. As described herein above, an external device (EXD, as shown in FIG. 1) may be mounted on the wiring pad WPD. The external device EXD may be mounted on the wiring pad WPD through an anisotropic conductive film, ultrasonic bonding, and/or the like.

Each pixel PX on the first substrate 110 includes a pixel driving circuit. The aforementioned wirings may apply driving signals to each pixel driving circuit while passing through (e.g., while the driving signal passes through the wirings of) each pixel PX or the periphery thereof. The pixel driving circuit may include a transistor(s) and/or a capacitor(s). Each of the number of transistors and the number of capacitors in each pixel driving circuit may be any suitable number and may vary (e.g., may vary from embodiment to embodiment or from pixel to pixel in an embodiment). Hereinafter, a pixel driving circuit having a 3T1C structure including three transistors and one capacitor will be described as an example, but the present disclosure is not limited thereto. Pixel driving circuits having various suitable structures, such as a 2T1C structure, a 7T1C structure, and a 6T1C structure may be applied.

Figure 4:
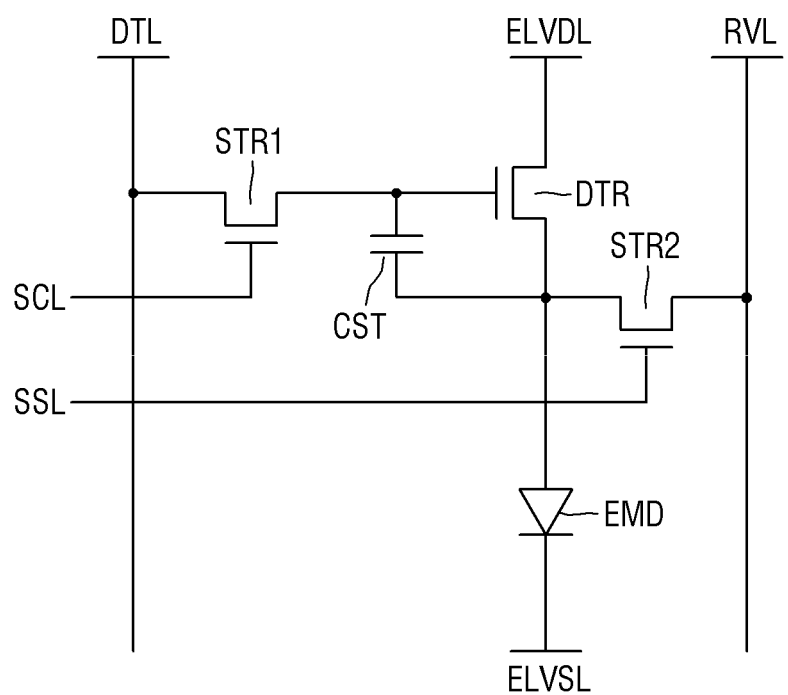
FIG. 4 is an equivalent circuit diagram of one pixel of a display device according to an embodiment.

FIG. 4 is an equivalent circuit diagram of one pixel of a display device according to an embodiment.

Referring to FIG. 4, each pixel PX of a display device according to an embodiment includes three transistors DTR, STR1, and STR2 and one storage capacitor CST in addition to the light emitting element EMD.

The light emitting element EMD emits light according to a current supplied through the driving transistor DTR. The light emitting element EMD may be implemented as an organic light emitting diode, a micro light emitting diode, a nano light emitting diode, or the like.

The first electrode (e.g., the anode electrode) of the light emitting element EMD may be connected (e.g., electrically connected) to a source electrode of the driving transistor DTR, and the second electrode (e.g., the cathode electrode) of the light emitting element EMD may be connected (e.g., electrically connected) to a second power line ELVSL supplied with a low potential voltage (second power supply voltage) lower than a high potential voltage (first power supply voltage) of the first power supply line ELVDL.

The driving transistor DTR adjusts a current flowing from the first power supply line ELVDL supplied with the first power supply voltage to the light emitting element EMD according to a difference in voltage between a gate electrode and the source electrode of the driving transistor DTR. The gate electrode of the driving transistor DTR may be connected (e.g., electrically connected) to the first source/drain electrode of the first switching transistor STR1, the source electrode of the driving transistor DTR may be connected (e.g., electrically connected) to the first electrode of the light emitting element EMD, and the drain electrode of the driving transistor DTR may be connected (e.g., electrically connected) to the first power supply line ELVDL to which the first power supply voltage is applied.

The first switching transistor STR1 is turned on by a scan signal of the scan line SCL to connect (e.g., electrically connect) the data line DTL to the gate electrode of the driving transistor DTR. The gate electrode of the first switching transistor STR1 may be connected (e.g., electrically connected) to the scan line SCL, the first source/drain electrode of the first switching transistor STR1 may be connected e.g., electrically connected) to the gate electrode of the driving transistor DTR1, and the second source/drain electrode of the first switching transistor STR1 may be connected (e.g., electrically connected) to the data line DTL.

The second switching transistor STR2 is turned on by a sensing signal of the sensing signal line SSL to connect (e.g., electrically connect) the reference voltage line RVL to the source electrode of the driving transistor DTR. The gate electrode of the second switching transistor STR2 may be connected (e.g., electrically connected) to the sensing signal line SSL, the first source/drain electrode of the second switching transistor STR2 may be connected (e.g., electrically connected) to the reference voltage line RVL, and the second source/drain electrode of the second switching transistor STR2 may be connected (e.g., electrically connected) to the source electrode of the driving transistor DTR.

In an embodiment, the first source/drain electrode of each of the first and second switching transistors STR1 and STR2 may be a source electrode, and the second source/drain electrode thereof may be a drain electrode. However, the present disclosure is not limited thereto. For example, in some embodiments the first source/drain electrode and the second source/drain electrode may be a drain electrode and a source electrode, respectively, for at least one selected from the first and second switching transistors STR1 and STR2.

The storage capacitor CST is between (e.g., connected between) the gate electrode and the source electrode of the driving transistor DTR. The storage capacitor CST stores a difference voltage between the gate voltage (e.g., the voltage at the gate electrode) and the source voltage (e.g., the voltage at the source electrode) of the driving transistor DTR.

The driving transistor DTR and the first and second switching transistors STR1 and STR2 may be thin film transistors. Although it is illustrated in FIG. 4 that the driving transistor DTR and the first and second switching transistors STR1 and STR2 are N-type metal oxide semiconductor field effect transistors (MOSFETs), the present disclosure is not limited thereto. For example, the driving transistor DTR and the first and second switching transistors STR1 and STR2 may be P-type MOSFETs, or some of them may be N-type MOSFETs and others of them may be P-type MOSFETs.

Figure 5:
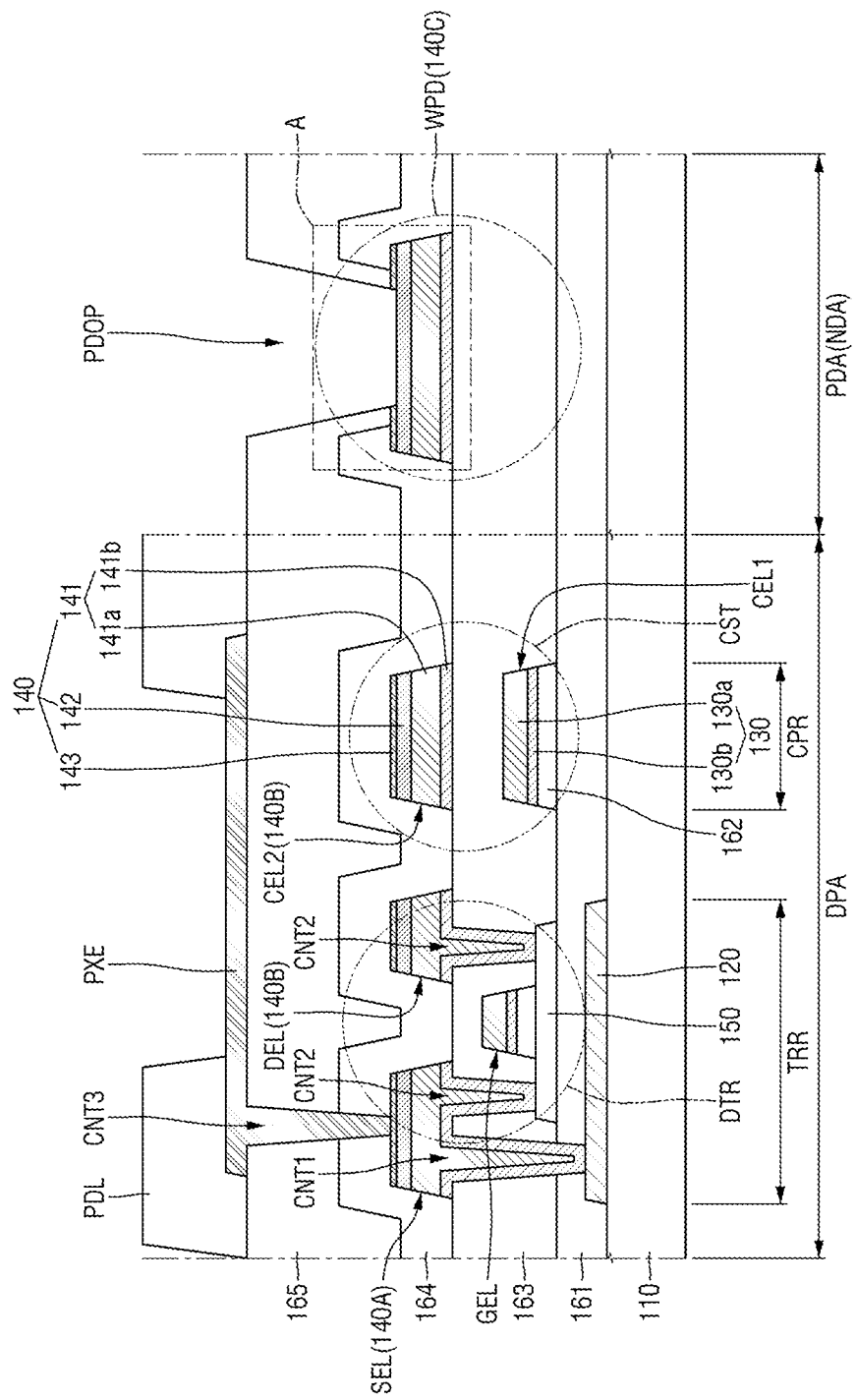
FIG. 5 is a cross-sectional view of a first display substrate of a display device according to an embodiment.
Figure 5A:
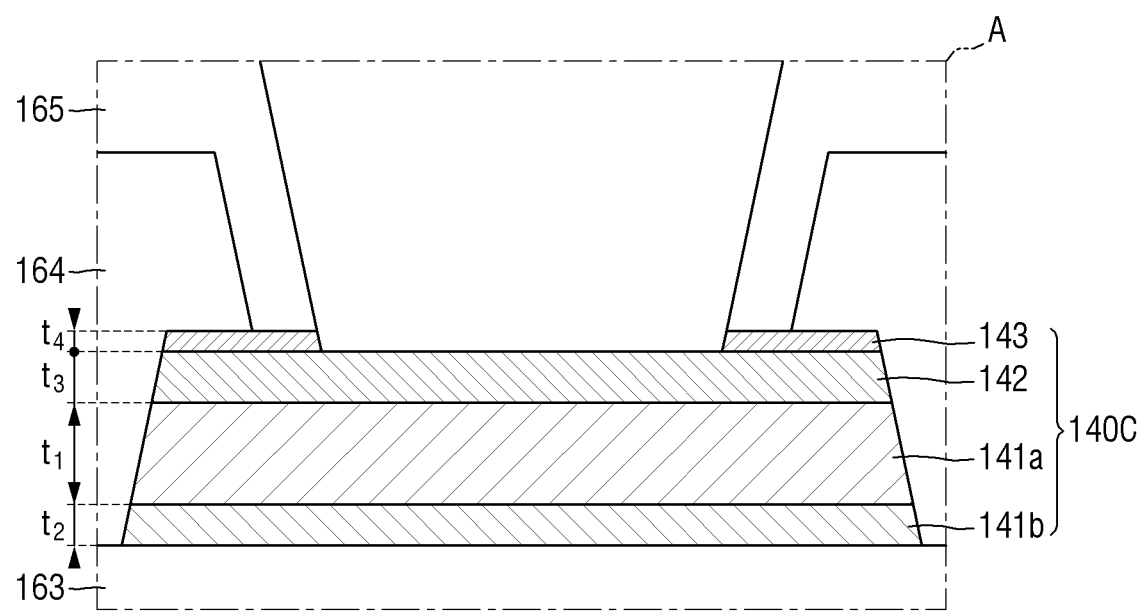
FIG. 5A is an enlarged view of the portion A in FIG. 5 according to an embodiment.

FIG. 5 is a cross-sectional view of a first display substrate of a display device according to an embodiment, and FIG. 5A is an enlarged view of the portion A in FIG. 5.

In FIG. 5, a cross section of a part of the display area DPA and a cross section of a part of the non-display area NDA are shown together. A cross section of the transistor region TRR and the capacitor region CPR of the pixel is illustrated as included in the cross section of the display area DPA, and a cross section of the pad area PDA is illustrated as included in the cross section of non-display area NDA. The transistor region TRR of FIG. 5 illustrates a region in which the driving transistor DTR of the three transistors is located. In FIG. 5, for convenience of illustration, only the pixel defining layer PDL in the laminated structure (e.g., the laminated structure of the display device) is illustrated on (e.g., mainly on) the circuit layer CCL of the first display substrate 100. FIG. 5A is a cross-sectional view of a wiring pad WPD in a pad area PDA according to an embodiment.

Referring to FIG. 5, the circuit layer CCL includes a semiconductor layer 150, a plurality of conductive layers, and a plurality of insulating layers, which are on the first substrate 110. The semiconductor layer 150 may include an oxide semiconductor. The plurality of conductive layers may include a lower metal layer 120, a gate conductive layer 130, a data conductive layer 140, and a pixel electrode PXE. The plurality of insulating layers may include a buffer layer 161, a gate insulating film 162, an interlayer insulating film 163, a passivation layer 164, and a via layer 165.

For example, the lower metal layer 120 is on the first substrate 110. The lower metal layer 120 may be a light blocking layer serving to protect the semiconductor layer 150 from external light. The lower metal layer 120 has a patterned shape. The lower metal layer 120 may be in the transistor region TRR. For example, in some embodiments, the lower metal layer 120 is not in the capacitor region CPR. The lower metal layer 120 may be under the semiconductor layer 150 to cover (e.g., overlap) the semiconductor layer 150 on the lower metal layer 120. For example, in some embodiments, the lower metal layer 120 is not under the capacitor CST. The lower metal layer 120 may be under the semiconductor layer 150 to cover (e.g., overlap) at least a channel region of the semiconductor layer 150, and in some embodiments, may cover (e.g., overlap) the entire semiconductor layer 150. The lower metal layer 120 may be electrically connected to the source electrode SEL of the driving transistor DTR through a first contact hole CNT1 to prevent or reduce a change of the voltage of the driving transistor DTR. The lower metal layer 120 may include a Ti/Cu double-layer film in which a titanium layer and a copper layer are laminated, but is not limited thereto.

The buffer layer 161 is on the lower metal layer 120. The buffer layer 161 may cover the entire surface of the first substrate 110 on which the lower metal layer 120 is located. The buffer layer 161 may include silicon nitride, silicon oxide, and/or silicon oxynitride. In an embodiment, the buffer layer 161 may include a double-layer film of $SiN_X$/$SiO_X$.

The semiconductor layer 150 is on the buffer layer 161. The semiconductor layer 150 is in the transistor region TRR and forms a channel of the driving transistor DTR. The semiconductor layer 150 may include an oxide semiconductor. Examples of the oxide semiconductor may include two-component compounds ($AB_X$), three-component compounds ($AB_X C_Y$), and four-component compounds ($AB_X C_Y D_Z$), each respectively containing (e.g., including) two, three, and four selected from indium, zinc, gallium, tin, titanium, aluminum, hafnium (Hf), zirconium (Zr), and magnesium (Mg). In an embodiment, the semiconductor layer 150 may include indium gallium zinc oxide (IGZO). In an embodiment, the semiconductor layer 150 may include indium tin zinc oxide (ITZO).

The gate insulating film 162 is on the buffer layer 161. The gate insulating film 162 may have the same pattern as the gate conductive layer 130 to be described in more detail herein below. The gate insulating film 162 in the transistor region TRR (e.g., the portion of the gate insulating film 162 in the transistor region TRR) may be on the semiconductor layer 150, and the gate insulating film 162 in the capacitor region CPR may be on the buffer layer 161. The sidewall of the gate insulating film 162 may be generally aligned with the sidewall of the gate conductive layer 130 to be described in more detail herein below. The gate insulating film 162 may include a silicon compound and/or a metal oxide. For example, the gate insulating film 162 may include silicon oxide, silicon nitride, silicon oxynitride, aluminum oxide, tantalum oxide, hafnium oxide, zirconium oxide, and/or titanium oxide. In an embodiment, the gate insulating film 162 may include a $SiO_X$ film.

The gate conductive layer 130 is on the gate insulating film 162. The gate electrode GEL in the transistor region TRR and the capacitor first electrode CEL1 (or lower electrode) in the capacitor region CPR may include the gate conductive layer 130. In addition, the scan line SCL and the sensing signal line SSL may include the gate conductive layer 130. The gate conductive layer 130 may not overlap the data conductive layer 140 in the pad area PDA to be described in more detail herein below. In some embodiments, the gate conductive layer 130 is not in the pad area PDA, but the present disclosure is not limited thereto. For example, in some embodiments, the gate conductive layer 130 is also formed in the pad area PDA.

The gate conductive layer 130 may include a single layer, or may include multiple layers. In an embodiment, the gate conductive layer 130 may include a gate main metal layer 130a and a gate base layer 130b under the gate main metal layer 130a. Both the gate main metal layer 130a and the gate base layer 130b may include a conductive material. An insulating layer may not be interposed between the respective constituent films of the gate conductive layer 130 (e.g., between the gain main metal layer 130a and the gate base layer 130b) overlapping each other in the thickness direction. The gate main metal layer 130a and the gate base layer 130b may be patterned by one mask process.

The gate base layer 130b may be under the gate main metal layer 130a to assist the film-forming property such as adhesion of the gate main metal layer 130a (e.g., adhesion of the gate main metal layer 130a to the gate insulating film 162) and/or to prevent or reduce the occurrence of a reactive material entering the gate main metal layer 130a from the underlying gate insulating film 162. Further, the gate base layer 130b may prevent or reduce diffusion toward the adjacent lower film (e.g., the gate insulating film 162) of the material (for example, copper) constituting the gate main metal layer 130a. The gate base layer 130b may include a material such as titanium (Ti), tantalum (Ta), calcium (Ca), chromium (Cr), magnesium (Mg), and/or nickel (Ni), but the material thereof is not limited thereto. The gate main metal layer 130a may serve to transmit a signal, and may include a low resistance material. The gate main metal layer 130a may be thicker than the gate base layer 130b, and may include a material having lower resistance than that of the gate base layer 130b. The gate main metal layer 130a may include a material such as copper (Cu), molybdenum (Mo), aluminum (Al), and/or silver (Ag), but the material thereof is not limited thereto.

The gate conductive layer 130 may further include agate capping layer on the gate main metal layer 130a. The gate capping layer covers the upper side of the gate main metal layer 130a to protect the gate main metal layer 130a. The gate capping layer may be in direct contact with the gate main metal layer 130a. However, the present disclosure is not limited thereto, and the gate capping layer may be thinner than the gate main metal layer 130a, and may include a material having higher resistance than that of the gate main metal layer 130a. The gate capping layer may serve to protect the gate main metal layer 130a from a layer on the gate conductive layer 130 or from an etchant or other chemicals used during the process of manufacturing the display device 1. Further, the gate capping layer may prevent or reduce diffusion of the material (for example, copper) constituting the gate main metal layer 130a toward the adjacent upper film (e.g., the interlayer insulating film 163).

The interlayer insulating film 163 is on the gate conductive layer 130. The interlayer insulating film 163 may be entirely on the gate conductive layer 130; the semiconductor layer 150 exposed by the gate conductive layer 130; and the buffer layer 161 exposed by the gate conductive layer 130, the gate insulating film 162, and the semiconductor layer 150. The interlayer insulating film 163 may include an inorganic insulating material such as silicon oxide, silicon nitride, silicon oxynitride, hafnium oxide, aluminum oxide, titanium oxide, tantalum oxide, and/or zinc oxide. In an embodiment, the interlayer insulating film 163 may include SiON.

Although it is illustrated in FIG. 5 that the upper surface of the interlayer insulating film 163 is flat in the display area DPA, the upper surface of the interlayer insulating film 163 including an inorganic material may have a lower step (e.g., a lower step shape or structure). Thus the thickness of the interlayer insulating film 163 for each section may vary along the horizontal directions and may be measured from the same flat reference surface (for example, the upper surface of the buffer layer 161) having no lower step structure.

The data conductive layer 140 is on the interlayer insulating film 163. The source electrode SEL and the drain electrode DEL in the transistor region TRR, the capacitor second electrode CEL2 (or upper electrode) in the capacitor region CPR, and the wiring pad WPD in the pad are PDA may each include a portion of the conductive layer 140. Each of the source electrode SEL and the drain electrode DEL may be connected to the semiconductor layer 150 through the second contact hole CNT2 penetrating through the interlayer insulating film 163. The source electrode SEL may also be connected to the lower metal layer 120 through the first contact hole CNT1 penetrating through the interlayer insulating film 163 and the buffer layer 161. In addition, the data line DTL, the reference voltage line RVL, and the first power supply line ELVDL may each include a portion of the data conductive layer 140.

Referring to FIGS. 5 and 5A, the data conductive layer 140 may have a laminated structure including a data conductive metal layer 141, a first data capping layer 142 on the data conductive metal layer 141, and a second data capping layer 143 on the first data capping layer 142. The data conductive metal layer 141 may include a single layer, or may include multiple layers. In an embodiment, the data conductive metal layer 141 may include a data main metal layer 141a and a data base layer 141b under the data main metal layer 141a.

Each of the data base layer 141b, the data main metal layer 141a, the first data capping layer 142, and the second data capping layer 143 may include a conductive material. An insulating layer may not be interposed between the respective constituent layers of the data conductive layer 140 overlapping each other in the thickness direction. The data base layer 141b, the data main metal layer 141a, the first data capping layer 142, and the second data capping layer 143 may be patterned by one mask process. The process of forming the laminated structure of the data conductive layer 140 will be described in more detail herein below.

Similarly to the gate base layer 130b, the database layer 141b may assist the film-forming property such as adhesion of the data main metal layer 141a (e.g., adhesion of the data main metal layer 141a to the first data capping layer 142) and/or to prevent or reduce the occurrence of a reactive material from entering the data main metal layer 141a from the underlying interlayer insulating film 163. The data base layer 141b may include a material such as titanium (Ti), tantalum (Ta), calcium (Ca), chromium (Cr), magnesium (Mg), and/or nickel (Ni), but the material thereof is not limited thereto.

The data main metal layer 141a may serve to transmit a signal, and may include a low resistance material. The data main metal layer 141a may be thicker than the data base layer 141b, the first data capping layer 142, and the second data capping layer 143. The data main metal layer 141a may include a material having a lower resistance than that of the first data capping layer 142 directly on the data main metal layer 141a and/or the data base layer 141b directly under the data main metal layer 141a. The data main metal layer 141a may include a material such as copper (Cu), aluminum (Al), silver (Ag), and/or molybdenum (Mo), but the material thereof is not limited thereto.

The first data capping layer 142 covers and protects the data main metal layer 141a from above. During a manufacturing process (for example, a process of forming the pixel electrode PXE) after forming the data conductive layer 140 to be described in more detail herein below, the first data capping layer 142 (e.g., a portion of the first data capping layer 142 in the pad area PDA) may be on the (e.g., may be the) uppermost layer of the data conductive layer 140 even when the second data capping layer 143 is exposed and etched to an etchant or other chemicals used in the manufacturing process, thereby serving to protect the data main metal layer 141a. Further, during the manufacturing process, the first data capping layer 142 may prevent or reduce the direct contact of the via layer 165 on the data conductive layer 140 with the data main metal layer 141a, thereby preventing or reducing the corrosion of the data main metal layer 141a by the material of the via layer 165. In addition, the first data capping layer 142 may prevent or reduce the diffusion toward the adjacent upper film (e.g., the passivation layer 164) of the material (for example, copper) constituting the data main metal layer 141a. The first data capping layer 142 may be in direct contact with the data main metal layer 141a.

The first data capping layer 142 may include Ti, ZIO, and/or IZO. For example, the first data capping layer 142 may include a single film such as a Ti film, a ZIO film, or an IZO film, but the present disclosure is not limited thereto, and in some embodiments the first data capping layer 142 may include multiple films thereof.

The second data capping layer 143 is on the first data capping layer 142. The second data capping layer 143 may include a material having a selectivity to an etchant used in the same etching process similar to that of the data main metal layer 141a. For example, in some embodiments, the selectivity of the second data capping layer 143 may be the same or similar to the selectivity of the main metal layer 141a for the same etchant. For example, when the data main metal layer 141a includes copper (Cu), the second data capping layer 143 may include copper (Cu), ZIO, or the like having a selectivity the same as or similar to that of the copper (Cu) included in the data main metal layer 141a.

When the second data capping layer 143 includes a material having a selectivity similar to that of the data main metal layer 141a for the same etchant, the occurrence of tips formed by the protrusion of the first data capping layer 142 outward from (e.g., away from) the upper surface of the data main metal layer 141a may be suppressed (e.g., reduced) even when the first data capping layer 142 on the data main metal layer 141a includes a material having a selectivity different from that of the data main metal layer 141a for the same etchant. More details thereof will be described herein below.

When tips occur in the first data capping layer 142 on the data main metal layer 141a, the tips of the first data capping layer 142 may cause the occurrence of cracks (e.g., cracks in the passivation layer 164) due to poor step coverage during the deposition process of the passivation layer 164 to be described in more detail herein below. For example, in the second data capping layer 143 including a material having a similar selectivity to the material included in the data main metal layer 141a for the same etchant, the selectivity thereof is changed depending on the material included in each constituent layer of the data conductive layer 140 during the process of forming the conductive pattern of the data conductive layer 140. Thus, the second data capping layer 143 may serve to prevent or reduce the occurrence of tips formed on the upper surface of the data main metal layer 141a. Therefore, the reliability of the circuit layer CCL may be improved.

In an embodiment, the data conductive layer 140 may include a database layer 141b including titanium (Ti), a data main metal layer 141a including copper (Cu), a first data capping layer 142 including titanium (Ti), and a second data capping layer 143 including copper (Cu). For example, the data conductive layer 140 may include a quadruple-layer film of Ti/Cu/Ti/Cu. When the data conductive layer 140 includes the quadruple-layer film of Ti/Cu/Ti/Cu, side surfaces (or side walls) of the data base layer 141b, the data main metal layer 141a, the first data capping layer 142, and the second data capping layer 143 may be aligned with each other. For example, the upper surface of a layer constituting the data conductive layer 140 and the lower surface of another layer constituting the data conductive layer 140 on and in contact with the upper surface may be aligned without protruding from each other. For example, in some embodiments, the upper surface of a first layer included in the data conductive layer 140 and the lower surface of a second layer included in the data conductive layer 140, which is on and in contact with the upper surface of the first layer, may be aligned without protruding from each other. In some embodiments, ZIO is applied to the second data capping layer 143 (e.g., the second data capping layer 143 includes, or is, ZIO), so that the data conductive layer 140 may have a laminated structure of Ti/Cu/Ti/ZIO.

Referring to FIG. 5A, the thicknesses of the data main metal layer 141a, the data base layer 141b, the first data capping layer 142, and the second data capping layer 143 of the data conductive layer 140 may be different from each other. Each of the thicknesses t1, t2, t3, and t4 of the conductive layers 141a, 141b, 142, and 143, respectively, constituting the data conductive layer 140 will be defined as a distance from the lower surface to the upper surface of each of the respective conductive layers.

As described herein above, the thickness t1 of the data main metal layer 141a may be greater than the thickness t2 of the data base layer 141b, the thickness t3 of the first data capping layer 142, and the thickness t4 of the second data capping layer 143. The thicknesses t2 and t3 of the data base layer 141b and the first data capping layer 142, respectively, that are in direct contact with the lower surface and the upper surface of the data main metal layer 141a, respectively, and protect the data main metal layer 141a may be sufficiently (e.g., suitably) thick. The thickness t4 of the second data capping layer 143 that is not in direct contact with the data main metal layer 141a and is partially removed in a subsequent process (to be described in more detail herein below) may not be as thick as the thicknesses t2 or t3 of the data base layer 141b or the first data capping layer 142, respectively. In an exemplary embodiment, when the data conductive layer 140 is a quadruple-layer film of Ti/Cu/Ti/Cu, the thickness t1 of the data main metal layer 141a is 11000 Å, the thickness t2 of the data base layer 141b is 200 Å, the thickness t3 of the first data capping layer 142 is 250 Å, and the thickness t4 of the second data capping layer 143 may be 20 Å or more and 300 Å or less (e.g., within the range of 20 Å to 300 Å). As used herein, the term A refers to an angstrom, which is a unit of distance equal to $10^{-10}$ meters. The thickness t4 of the second data capping layer 143 may be 20 Å or more and 300 Å or less such that the second data capping layer 143 exposed by a pad opening PDOP may be easily etched in the etching process of the material layer for pixel electrodes, which will be described in more detail herein below.

Referring to FIG. 5 again, the data conductive layer 140 may include a first region 140B, a second region 140A, and a third region 140C depending on the structure of the second data capping layer 143 on the uppermost layer of the data conductive layer 140 and/or the structure of the layer on the data conductive layer 140 contacting the upper surface of the second data capping layer 143. In the first region 140B, the second region 140A, and the third region 140C of the data conductive layer 140, the structure of the second data capping layer 143 of the data conductive layer 140 may be different, and/or the layer contacting the upper surface of the second data capping layer 143 may be different. More details of the respective regions 140A, 140B, and 140C of the data conductive layer 140 will be described in more detail herein below.

The passivation layer 164 is on the data conductive layer 140. The passivation layer 164 serves to cover and protect the data conductive layer 140. The passivation layer 164 may include an inorganic insulating material such as silicon oxide, silicon nitride, silicon oxynitride, hafnium oxide, aluminum oxide, titanium oxide, tantalum oxide, and/or zinc oxide.

The passivation layer 164 may be entirely in the display area DPA (e.g., in the entire display area DPA), and may be absent from at least a part of the non-display area NDA. The passivation layer 164 may not be on (e.g., may be absent from) at least a part of the third region 140C or the wiring pad WPD of the data conductive layer 140 in the pad area PDA included in the non-display area NDA. In some embodiments, the passivation layer 164 does not overlap at least a part of the third region 140C of the data conductive layer 140.

The via layer 165 is on the passivation layer 164. The via layer 165 may cover the upper surface of the passivation layer 164 (e.g., the upper surface of the passivation layer 164 in both the display area DPA and in the non-display area NDA), and may cover the side surface of the end portion of the passivation layer 164 in the pad area PDA.

The via layer 165 may be provided with a pad opening PDOP that exposes the passivation layer 164 and at least a part of the third region 140C of the data conductive layer 140 in the pad area PDA. The via layer 165 (e.g., the portion of the via layer 165) constituting the inner wall of the pad opening PDOP may cover the side surface of the end portion of the passivation layer 164 in the pad area PDA, but the present disclosure is not limited thereto. For example, the pad opening PDOP may be formed by the passivation layer 164 and the via layer 165 in the pad area PDA, and the inner walls of the passivation layer 164 and the via layer 165 forming the pad opening PDOP may be aligned with each other.

The via layer 165 may include an organic insulating material such as a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB). The via layer 165 may further include a photosensitive material, but the material thereof (e.g., the via layer 165) is not limited thereto. In an embodiment, the via layer 165 may include polyimide.

A pixel electrode PXE is on the via layer 165. The material constituting the pixel electrode PXE is the same as that (e.g., as the material of the pixel electrode PXE) described with reference to FIG. 2. In an embodiment, the pixel electrode PXE may include a three-layer film of ITO/Ag/ITO.

The pixel electrode PXE may be in the display area DPA and not in the non-display area NDA. The pixel electrode PXE may overlap the transistor region TRR and the capacitor region CPR of the display area DPA, but the present disclosure is not limited thereto. The pixel electrode PXE may be connected to the source electrode SEL of the driving transistor DTR through the third contact hole CNT3 penetrating through the via layer 165 and the passivation layer 164.

A pixel defining layer PDL may be in the display area DPA and not in the non-display area NDA. The pixel defining layer PDL overlaps the edge portion of the pixel electrode PXE. The pixel defining layer PDL is also on the via layer 165 where the pixel electrode PXE is not formed. For example, in some embodiments, the pixel defining layer PDL may be absent from the non-display area NDA.

Hereinafter, the aforementioned regions 140A, 140B, 140C of the data conductive layer 140 will be described in more detail.

The data conductive layer 140 may include a first region 140B entirely covered by the passivation layer 164, a second region 140A overlapping the third contact hole CNT3, and a third region 140C exposed by the pad opening PDOP. The first region 140B and the second region 140A of the data conductive layer 140 are in the display area DPA, and the third region 140C of the data conductive layer 140 is in the non-display area NDA.

The second region 140A of the data conductive layer 140 may be in the transistor region TRR. The source electrode SEL of the driving transistor DTR may include (e.g., may be) the second region 140A of the data conductive layer 140 in the transistor region TRR. The first region 140B of the data conductive layer 140 may be in the transistor region TRR and/or in the capacitor region CPR of the display area DPA. The source/drain electrode of the transistor (e.g., the drain electrode DEL of the driving transistor DTR) and/or the capacitor second electrode CEL2 of the storage capacitor CST may include (e.g., may be) the first region 140B of the data conductive layer 140.

In the data conductive regions 140A and 140B in the display area DPA, the second data capping layer 143 may entirely cover the upper surface of the first data capping layer 142. For example, the first data capping layer 142 of the second region 140A of the data conductive layer 140 and the first data capping layer 142 of the first region 140B of the data conductive layer 140 may not be exposed by the second data capping layer 143.

The passivation layer 164 and the pixel electrode PXE may be on the upper surface of the second region 140A of the data conductive layer 140. The second region 140A of the data conductive layer 140 may be connected to the pixel electrode PXE through the third contact hole CNT3. For example, the passivation layer 164 and the pixel electrode PXE may be on the upper surface of the second data capping layer 143 of the second region 140A of the data conductive layer 140. The pixel electrode PXE may be on at least a part of the upper surface of the second data capping layer 143 of the second region 140A of the data conductive layer 140 overlapping the third contact hole CNT3, and the passivation layer 164 may be on the remaining part of the upper surface of the second data capping layer 143 of the second region 140A of the data conductive layer 140. The pixel electrode PXE may fill the inner space of the third contact hole CNT3 and contact the upper surface of the second data capping layer 143 of the second region 140A of the data conductive layer 140 overlapping the third contact hole CNT3 to be electrically connected to the upper surface thereof.

The passivation layer 164 may be on the upper surface of the first region 140B of the data conductive layer 140. For example, the passivation layer 164 may be on the upper surface of the second data capping layer 143 of the first region 140B of the data conductive layer 140. The passivation layer 164 on the upper surface of the second data capping layer 143 of the first region 140B of the data conductive layer 140 may be on the entire surface of the second data capping layer 143 of the first region 140B of the data conductive layer 140 to completely cover the first region 140B of the data conductive layer 140.

The third region 140C of the data conductive layer 140 may be in the pad area PDA. The wiring pad WPD of the pad area PDA may include (e.g., may be) the third region 140C of the data conductive layer 140 in the pad area PDA.

In the data conductive layer 140 in the non-display area NDA, for example, the third region 140C of the data conductive layer 140, the second data capping layer 143 of the third region 140C of the data conductive layer 140 may not at least partially overlap the first data capping layer 142. Accordingly, the second data capping layer 143 of the third region 140C of the data conductive layer 140 may expose at least a part of the upper surface of the first data capping layer 142 of the third region 140C of the data conductive layer 140. The second data capping layer 143 of the third region 140C of the data conductive layer 140 may not be in an area overlapping the pad opening PDOP. Accordingly, the upper surface (e.g., at least a portion of the upper surface) of the first data capping layer 142 of the third region 140C of the data conductive layer 140 may be exposed by the pad opening PDOP.

The second data capping layer 143 of the third region 140C of the data conductive layer 140 may include an inner side surface located at a side of the pad opening PDOP and an outer side surface located at a side opposite to the side on which the inner side surface is located. In an embodiment, the inner side surface of the second data capping layer 143 of the third region 140C of the data conductive layer 140 may be aligned with the inner wall of the via layer 165 constituting the pad opening PDOP. However, the present disclosure is not limited thereto, and the inner side surface of the second data capping layer 143 of the third region 140C of the data conductive layer 140 may not be aligned with the inner wall of the via layer 165. As described above, the outer side surface of the second data capping layer 143 of the third region 140C of the data conductive layer 140 may be aligned with the side surface of the first data capping layer 142 under the second data capping layer 143.

The data conductive layer 140 may be referred to as a first conductive layer, the pixel electrode PXE may be referred to as a second conductive layer, and the gate conductive layer 130 may be referred to as a third conductive layer. The data base layer 141*b*, the data main metal layer 141*a*, the first data capping layer 142, and the second data capping layer 143, constituting the first conductive layer (for example, the data conductive layer 140) may be referred to as a base layer, a main metal layer, a first conductive capping layer, and a second conductive capping layer, respectively. The passivation layer 164 between the first conductive layer (for example, the data conductive layer 140) and the second conductive layer (for example, the pixel electrode PXE) may be referred to as a first insulating film, and the interlayer insulating film 163 between the first conductive layer (for example, the data conductive layer 140) and the third conductive layer (for example, the gate conductive layer 130) may be referred to as a second insulating layer.

Hereinafter, a method of manufacturing the display device will be described.

FIGS. 6 to 15 are cross-sectional views illustrating process steps of a method of manufacturing the display device of FIG. 5, according to an embodiment.

Referring to FIG. 6, first, a patterned lower metal layer 120 is formed on a first substrate 110. The patterned lower metal layer 120 may be formed by a mask process. For example, a material layer for the lower metal layer is entirely deposited on the first substrate 110, and is patterned by a photolithography process, thereby forming the lower metal layer 120 shown in FIG. 6.

Subsequently, referring to FIG. 7, a buffer layer 161 is formed on the entire surface of the first substrate 110 on which the lower metal layer 120 is formed. For example, the buffer layer 161 may be on the first substrate 110 and on the lower metal layer 120. Subsequently, a semiconductor layer 150 is formed on the buffer layer 161. The semiconductor layer 150 may be formed by a mask process. For example, an oxide semiconductor is entirely deposited on the buffer layer 161, and is patterned by a photolithography process, thereby forming the semiconductor layer 150 shown in FIG. 7.

Subsequently, referring to FIG. 8, a gate insulating film 162 and a gate conductive layer 130, which are patterned, are formed on the buffer layer 161 on which the semiconductor layer 150 is formed. For example, the gate insulating film 162 and the gate conductive layer 130 may be formed on the buffer layer 161 and on the semiconductor layer 150. The gate insulating film 162 and the gate conductive layer 130, which are patterned, may be formed by one mask process.

For example, a material layer for the gate insulating film is deposited on the buffer layer 161 on which the semiconductor layer 150 is formed. For example, a material layer for the gate insulating film may be deposited on the buffer layer 161 and on the semiconductor layer 150. Then, a material layer for a gate base layer and a material layer for a gate main metal layer are sequentially deposited on the material layer for the gate insulating film. Then, a photoresist layer is applied on the material layer for the gate main metal layer, a photoresist pattern is formed through exposure and development, and then the material layer for the gate main metal layer, the material layer for the gate base layer, and the material layer for the gate insulating film are sequentially etched using the photoresist pattern as a mask. Then, the photoresist pattern is removed through a stripping or ashing process. Although a case where the photoresist pattern is used as an etching mask until the gate insulating film 162 is patterned has been described above, embodiments of the present disclosure are not limited thereto. In some embodiments, the patterned upper layer may be used as a hard mask for etching the lower layer thereof. In this case, the photoresist pattern may be used as an etching mask together with a hard mask. For example, in some embodiments, the photoresist pattern may be used to pattern an upper layer (e.g., the material layer for the gate main metal layer), and the patterned upper layer (e.g., the gate main metal layer 130a) may be used as an etching mask to etch the lower layers (e.g., the mater layers for the gate base layer and the gate insulating film). In some embodiments, a hard mask is formed, the photoresist pattern is removed, and then the lower layer(s) is etched using the hard mask as an etching mask.

Figure 9:
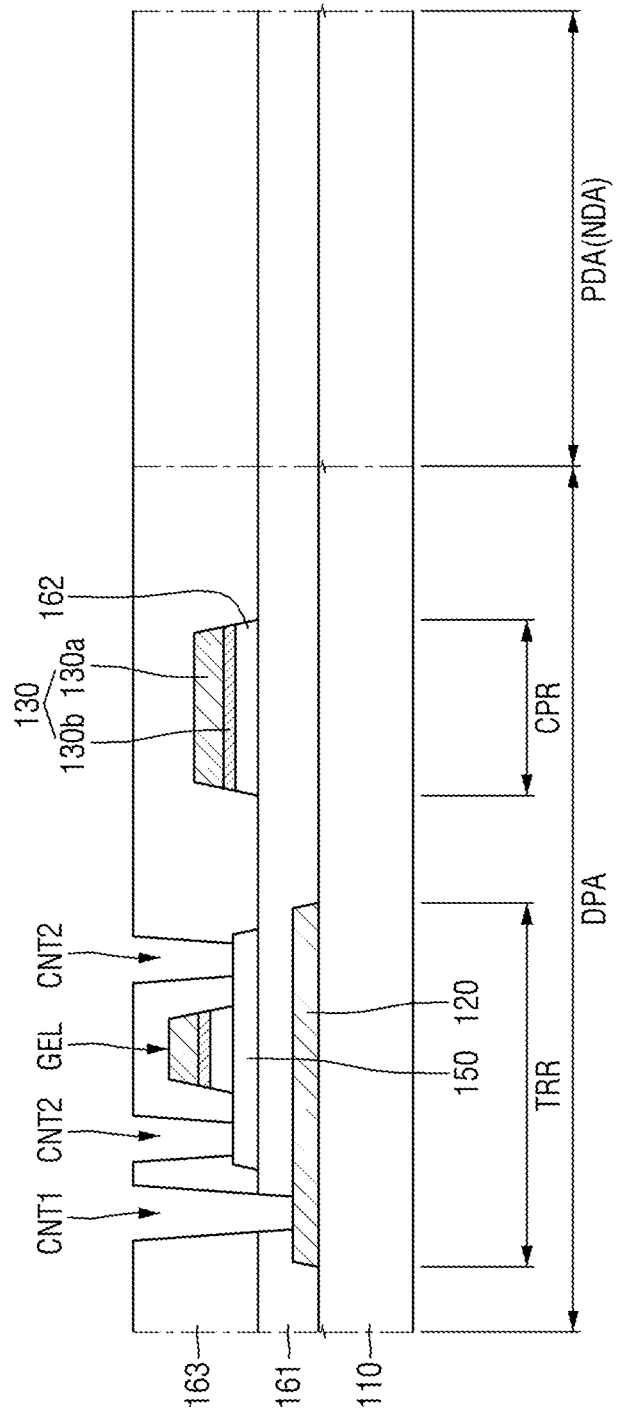

Subsequently, referring to FIG. 9, an interlayer insulating film 163 is laminated (e.g., formed) on the buffer layer 161 on which the gate conductive layer 130 is formed, and a first contact hole CNT1 exposing a part of the lower metal layer 120 and a second contact hole CNT2 exposing a part (e.g., a source region and a drain region) of the semiconductor layer 150 are formed. The contact holes CNT1 and CNT2 may be formed by a mask process. The first contact hole CNT1 and the second contact hole CNT2 may be sequentially formed by different masks. For example, an insulating layer for an interlayer insulating film is entirely deposited on the buffer layer 161 on which the gate conductive layer 130 is formed. Then, a first photoresist pattern exposing a part of the lower metal layer 120 is formed on the insulating layer for the interlayer insulating film, and the insulating layer for the interlayer insulating film and the buffer layer 161 are etched using the first photoresist pattern as an etching mask, thereby forming the first contact hole CNT1 exposing a part of the lower metal layer 120. After the first photoresist pattern is removed, a second photoresist pattern exposing a part of the semiconductor layer 150 is formed on the insulating layer for the interlayer insulating film, and the insulating layer for the interlayer insulating film is etched using the second photoresist pattern as an etching mask, thereby forming the second contact hole CNT2.

The first contact hole CNT1 and the second contact hole CNT2 may be formed by the same mask, but in this case, the semiconductor layer 150 may be exposed to an etchant while the buffer layer 161 is etched to form the first contact hole CNT1.

As described above, when the first contact hole CNT1 is formed first and then the second contact hole CNT2 is formed using a separate mask, surface damage of the semiconductor layer 150 exposed by the second contact hole CNT2 may be prevented or reduced.

Figure 10:
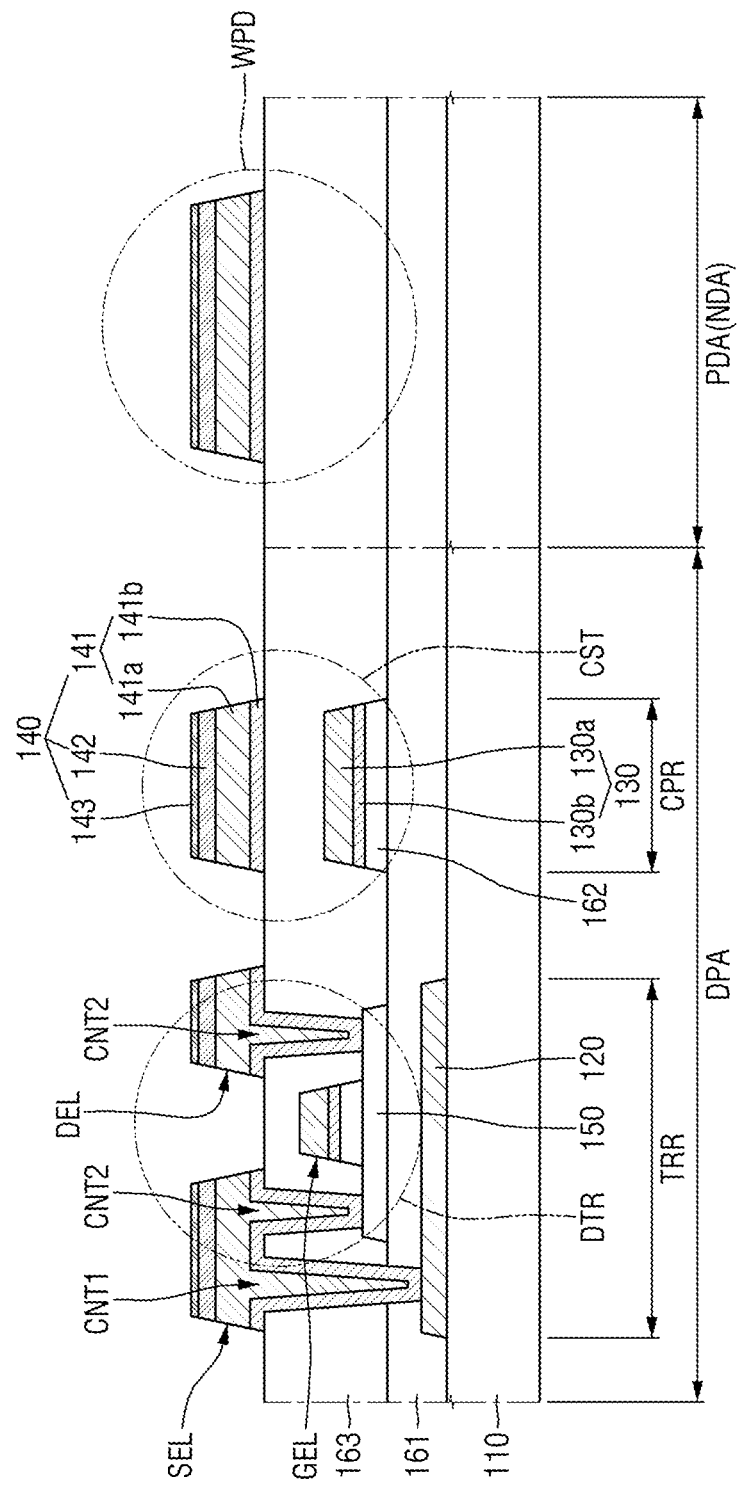

Subsequently, referring to FIG. 10, a patterned data conductive layer 140 is formed on the interlayer insulating film 163. The patterned data conductive layer 140 may be formed by a mask process. For example, a material layer for a data conductive metal layer, a material layer for a first data capping layer, and a material layer for a second data capping layer are sequentially deposited on the interlayer insulating film 163. In some embodiments, the material layer for the data conductive metal layer may include a material layer for a data base layer 141b and a material layer for a data main metal layer 141a, which may be sequentially deposited on the interlayer insulating film 163. In an exemplary embodiment, when the data conductive layer 140 is formed to have a four-layer structure of Ti/Cu/Ti/Cu, a structure in which a copper (Cu)-containing (e.g., Cu-including) material layer for a data main metal layer and for a material layer for a second data capping layer are respectively deposited on a titanium (Ti)-containing (e.g., Ti-including) material layer for a data base layer and for a material layer for a first data capping layer, and may be formed by physical vapor deposition or sputtering. For example, in the deposition process, the material layer(s) for the data conductive metal layer, the material layer for the first data capping layer, and/or the material layer for the second data capping layer are deposited to the inside of the first contact hole CNT1 and the second contact hole CNT2, and thus may be connected (e.g., electrically connected) to the lower metal layer 120 and the semiconductor layer 150, respectively.

Subsequently, a photoresist layer is applied on (e.g., formed on) the material layer for the second data capping layer; a photoresist pattern is formed through exposure and development; and the material layer for the second data capping layer, the material layer for the first data capping layer, and the material layer(s) for the data conductive metal layer are etched using the photoresist pattern as an etching mask. Then, the photoresist pattern is removed through a stripping or ashing process to complete the patterned data conductive layer 140 shown in FIG. 10. As shown in FIG. 10, through this process, in the data conductive layer 140 in the transistor region TRR, the data conductive layer 140 in the capacitor region CPR, and the data conductive layer 140 in the pad area PDA, the second data capping layer 143 may be on the entire upper surface of the first data capping layer 142, and the sidewalls of the second data capping layer 143 and the first data capping layer 142 may be in parallel (e.g., substantially in parallel).

As described above, in an exemplary embodiment, even when the material layer for the data main metal layer includes copper (Cu) and the material layer for the first data capping layer includes titanium (Ti) having a different selectivity from copper (Cu) for the same etchant, the sidewalls of the data conductive layer 140 may be etched to be aligned with each other, when the material layer for the second data capping layer includes a material having a similar selectivity to the copper (Cu) included in the material layer for the data main metal layer (for example, copper (Cu)) for the same etchant. Accordingly, because the material layer for the second data capping layer is formed to include a material having a same or similar selectivity for the same etchant as a material included in the material layer for the data main metal layer, it is possible to prevent or reduce the formation of tips of the data capping layers 142 and 143, which may occur due to the difference in selectivities for the same etchant of the materials included in each layer of the data conductive layer 140.

Figure 11:
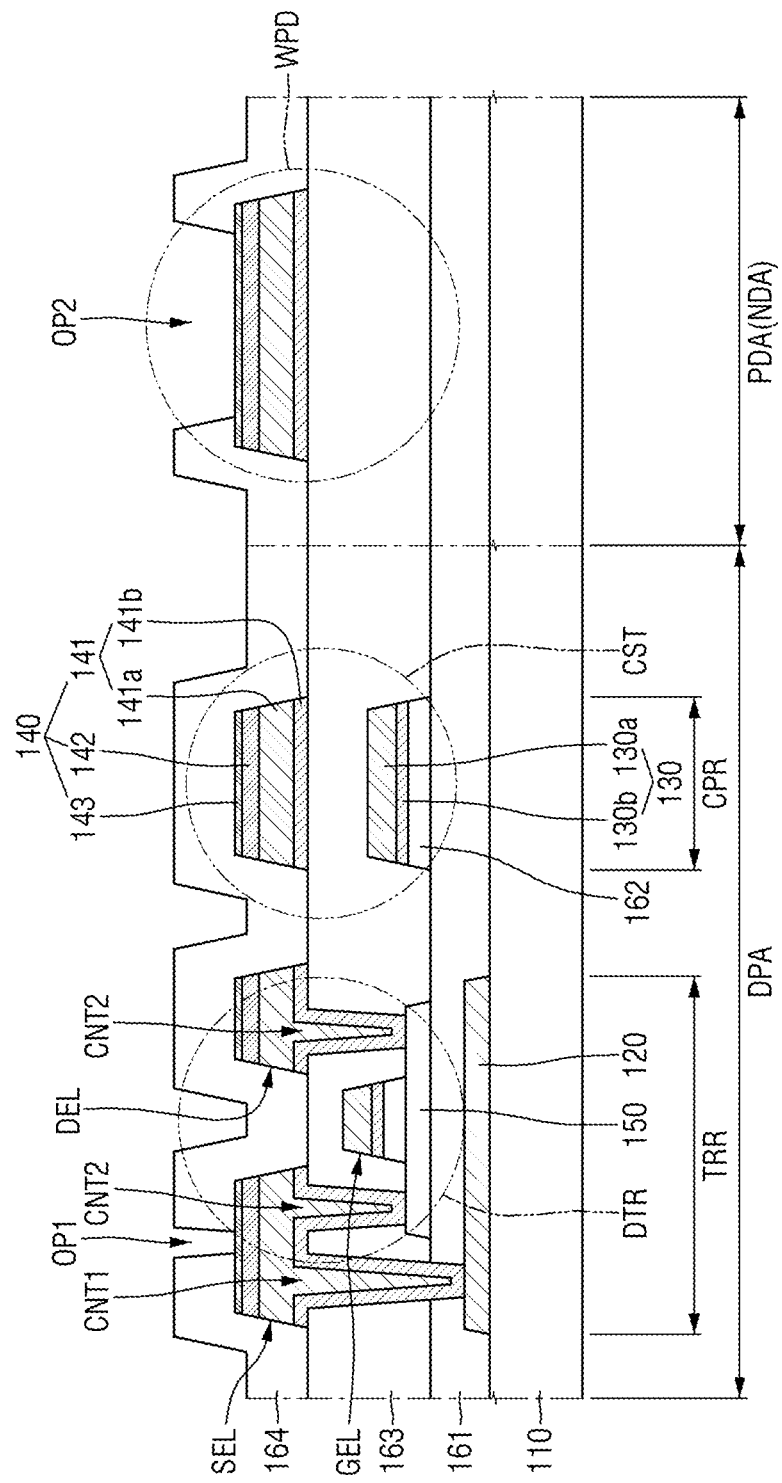

Subsequently, referring to FIG. 11, a passivation layer 164 is formed on the interlayer insulating film 163 on which the data conductive layer 140 is formed, and a photoresist pattern is formed on the passivation layer 164.

For example, a material layer for the passivation layer is entirely deposited on the interlayer insulating film 163 on which the data conductive layer 140 is formed. Subsequently, a photoresist layer is formed on the material layer for the passivation layer, and then a photoresist pattern is formed by exposure and development. The photoresist pattern may include a first opening OP1 exposing a region overlapping the source electrode SEL (e.g., the source electrode SEL of the driving transistor DTR) in the transistor region TRR and a second opening OP2 exposing a region overlapping the wiring pad WPD in the pad area PDA. In an embodiment, the width of the first opening OP1 may be smaller than or equal to the width of the corresponding source electrode SEL, and the width of the second opening OP2 may be smaller than or equal to the width of the data conductive layer (e.g., the wiring pad WPD) formed in the pad area PDA, but the present disclosure is not limited thereto.

Subsequently, the material layer for the passivation layer is etched using the photoresist pattern as an etching mask.

Through this process, the material layer for the passivation layer, exposed by the first opening OP1, is etched to form a contact hole exposing the source electrode SEL in the transistor region TRR. In addition, the material layer for the passivation layer, exposed by the second opening OP2, is removed (e.g., etched) together (e.g., together with the etching of the material layer for the passivation layer exposed by the first opening OP1) to expose the second data capping layer 143 of the data conductive layer 140 in the pad area PDA. For example, the passivation layer 164 is not on at least a part of the data conductive layer 140 in the pad area PDA, and at least a part of the data conductive layer 140 in the pad area PDA does not overlap the passivation layer 164 in the thickness direction.

Figure 12:
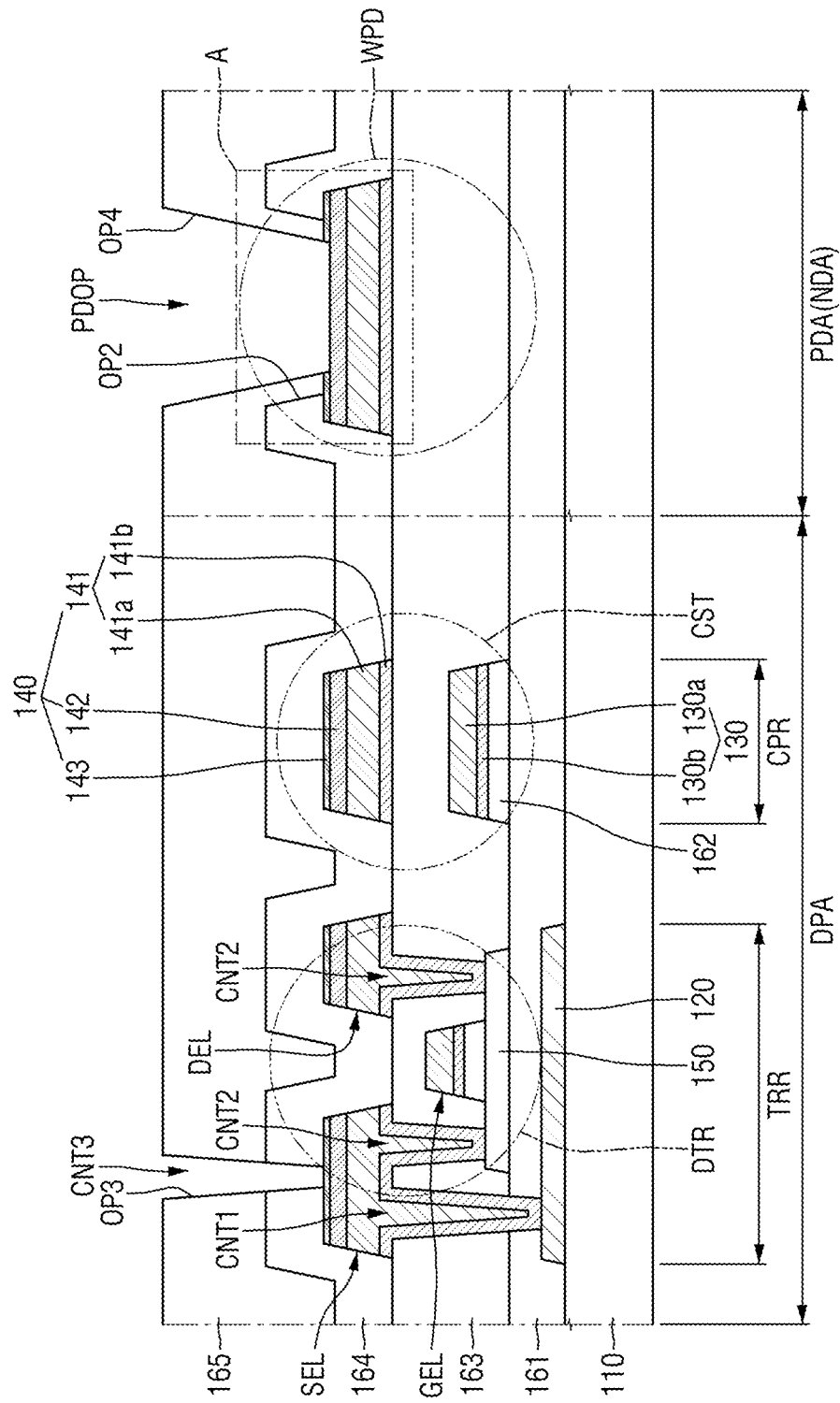

Subsequently, referring to FIG. 12, a patterned via layer 165 is formed on the passivation layer 164. The patterned via layer 165 includes a third opening OP3 exposing the first opening OP1 formed in the passivation layer 164 and a fourth opening OP4 exposing at least a part of the data conductive layer 140 in the pad area PDA. The third opening OP3 may form a third contact hole CNT3 together with the first opening OP1 of the passivation layer 164 exposing the source electrode SEL. The fourth opening OP4 may form a pad opening PDOP. In an embodiment, the width of the third opening OP3 may be greater than the first opening OP1 of the passivation layer 164, and the width of the fourth opening OP4 may be smaller than the width of the second opening OP2 of the passivation layer 164 in the pad area PDA, the second opening OP2 being formed through the process described with reference to FIG. 11. Accordingly, the via layer 165 in the pad area PDA may cover at least a part of the upper surface of the data conductive layer 140 in the pad area PDA exposed by the passivation layer 164 in the pad area PDA. Further, as described above, the via layer 165 constituting the inner wall of the fourth opening OP4 (or the pad opening PDOP) may cover the side surface of the end portion of the passivation layer 164 in the pad area PDA.

The via layer 165 may include, for example, an organic material including a photosensitive material. In this case, the patterned via layer 165 may be formed by applying (e.g., forming) the organic material layer for the via layer and then forming the openings OP3 and OP4 through exposure and development. The via layer 165 may have a different height for each region, and the via layer 165 having a different height for each region may be formed using a halftone mask or a slit mask.

Meanwhile, when applying (e.g., forming) the via layer 165, the via layer 165 and the data conductive layer 140 (e.g., a portion of the data conductive layer 140) may be in contact (e.g., physical or direct contact) with each other. In this case, because the first data capping layer 142 and/or the second data capping layer 143 are formed as an upper layer of the data conductive layer 140, the direct contact between the via layer 165 and the data conductive metal layer 141 may be prevented or reduced. Therefore, corrosion failure due to direct contact between the via layer 165 and the data conductive metal layer 141 may be prevented or reduced.

Subsequently, referring to FIGS. 13 and 14, a patterned pixel electrode PXE is formed on the via layer 165. The patterned pixel electrode PXE may be formed by a mask process.

Figure 13:
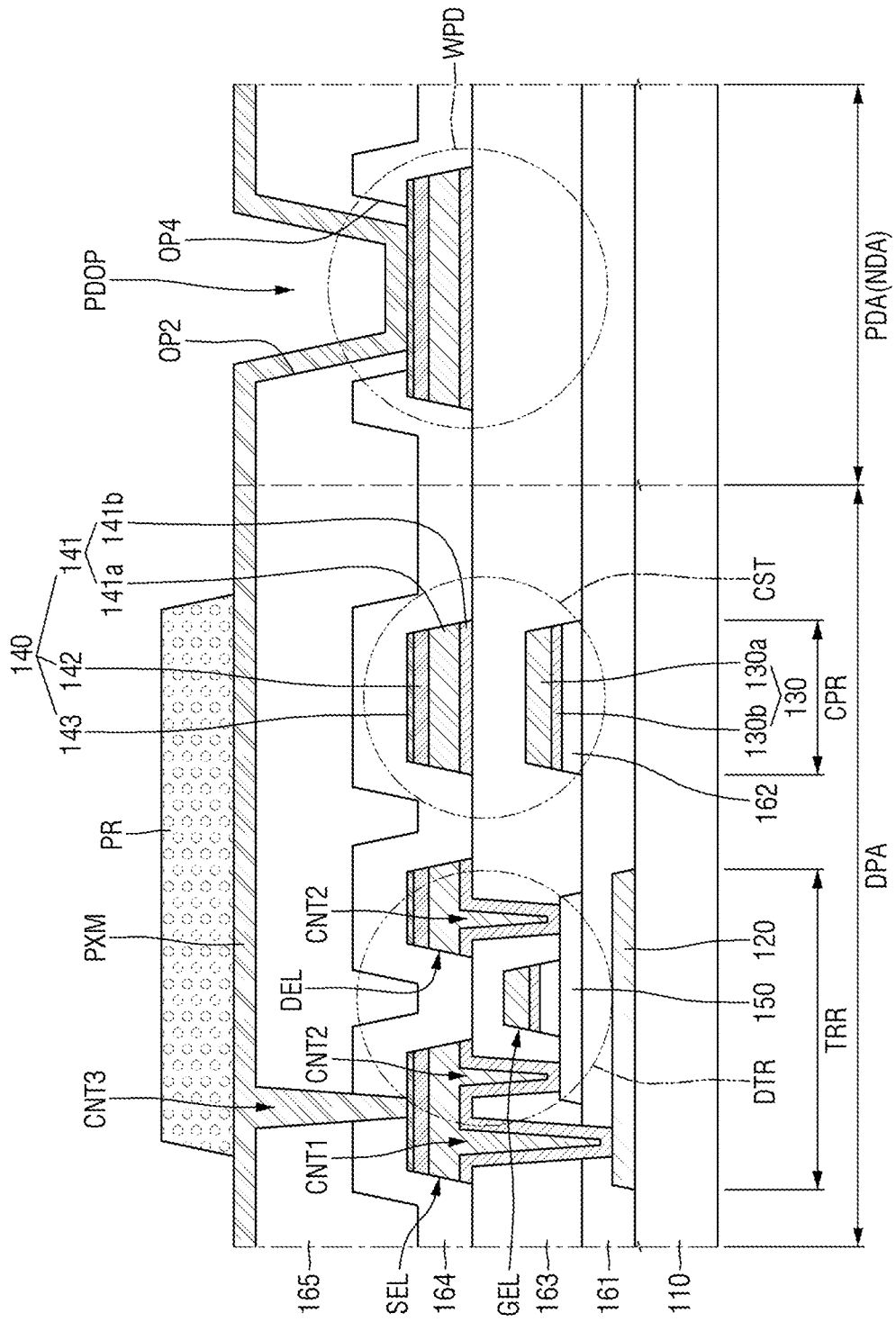
Figure 14:
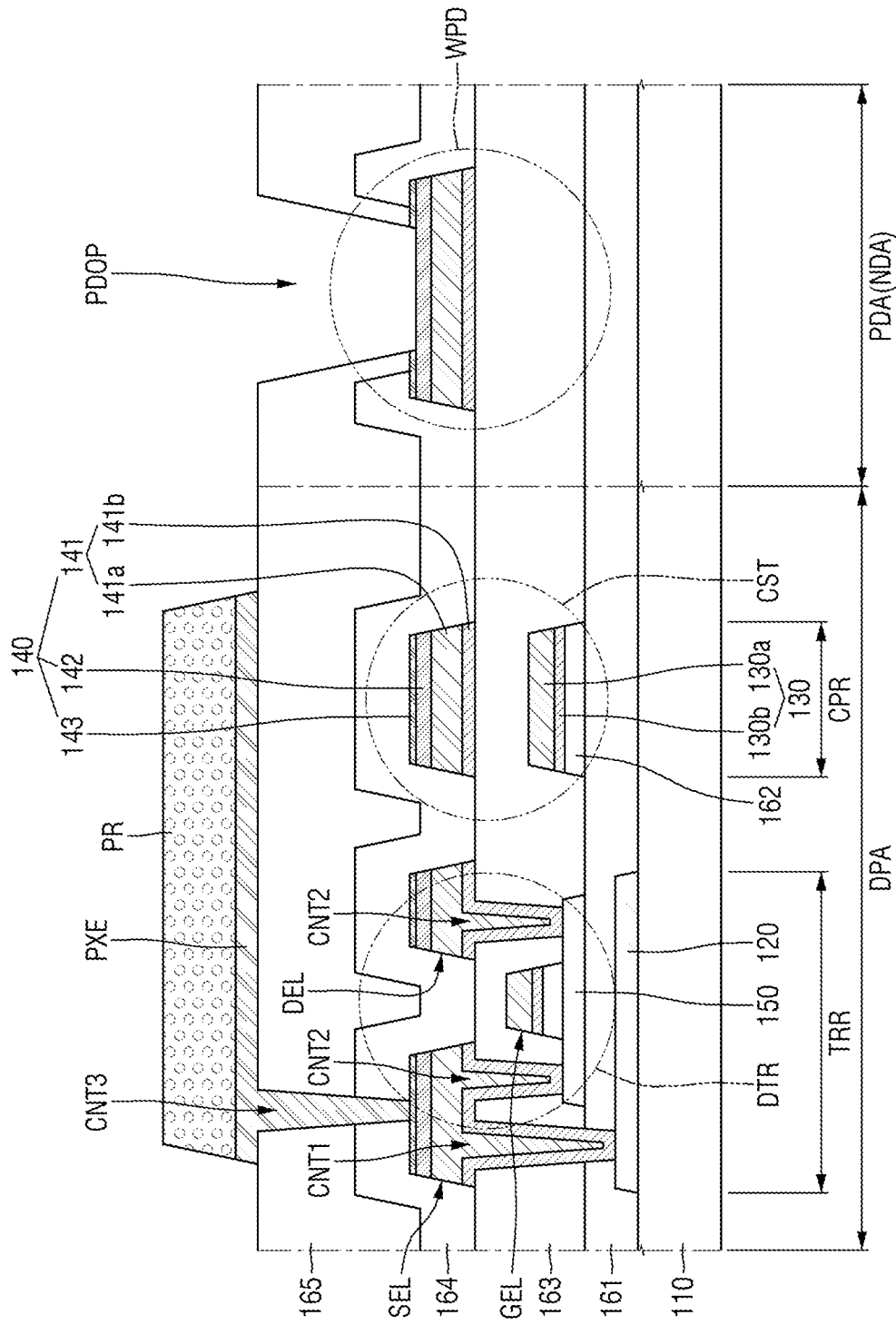

Referring to FIG. 13, for example, a material layer for a pixel electrode is entirely deposited on the via layer 165. In the deposition process, the material layer for the pixel electrode may be deposited to the inside of the third contact hole CNT3 to be connected to the source electrode SEL, and may be deposited to the inside of the pad opening PDOP to be on the data conductive layer 140 in the pad area PDA, the data conductive layer 140 being exposed by the pad opening PDOP. For example, the material layer for the pixel electrode may be in contact (e.g., physical or direct contact) with at least a part of the upper surface of the second data capping layer 143 of the second region 140A of the data conductive layer 140, the second region 140A constituting the source electrode SEL. Similarly, the material layer for the pixel electrode may be in contact (e.g., physical or direct contact) with at least a part of the upper surface of the second data capping layer 143 of the data conductive layer 140 in the pad area PDA.

Subsequently, a photoresist layer is applied (e.g., formed) on the material layer for the pixel electrode, and a photoresist pattern PR having a pattern shape of the pixel electrode PXE to be left through exposure and development is formed. Subsequently, the material layer for the pixel electrode is etched using the photoresist pattern PR as an etching mask. The etching of the material layer for the pixel electrode may be performed by wet etching, but the present disclosure is not limited thereto.

In this process, the material layer of the pixel electrode, on which the photoresist pattern PR is located, may be patterned by wet etching to form the pixel electrode PXE. Further, the material layer of the pixel electrode on the data conductive layer 140 in the pad area PDA where the photoresist pattern PR is not located is etched, so that the data conductive layer 140 of the pad area PDA is in contact (e.g., physical or direct contact) with an etchant used for etching the material layer of the pixel electrode, and thus the data conductive layer 140 may be damaged. Accordingly, at least a part of the second data capping layer 143 of the data conductive layer 140 in the pad area PDA, exposed by the pad opening PDOP of FIG. 14, may be in contact (e.g., physical or direct contact) with an etchant used for etching the material layer of the pixel electrode, and thus may be damaged and removed. Accordingly, in this process, the data conductive layer 140, for example, the third region 140C of the data conductive layer 140 in the pad area PDA of FIG. 5 may be formed. Thereafter, the photoresist pattern PR may be removed through a stripping and/or ashing process.

Figure 15:
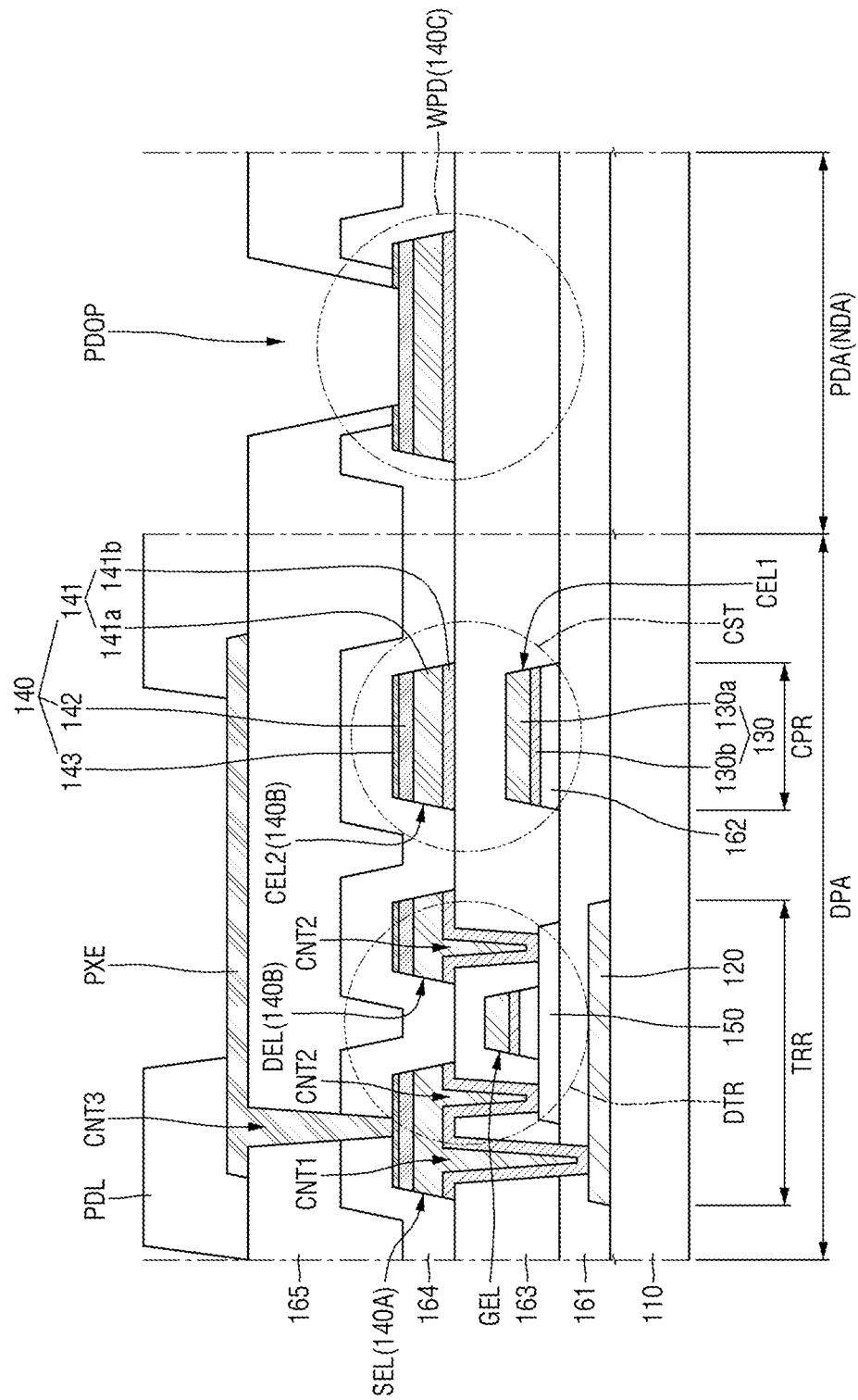

Subsequently, referring to FIG. 15, a patterned pixel defining layer PDL is formed on the via layer 165 on which the pixel electrode PXE is formed. The pixel defining layer PDL may include, for example, an organic material including a photosensitive material. In this case, the patterned pixel defining layer PDL may be formed through exposure and development after applying an organic material layer for a pixel defining layer.

The pixel defining layer PDL may be formed along the boundary of the pixel PX, and may partially overlap the pixel electrode PXE. The pixel defining layer PDL may be formed to overlap the third contact hole CNT3. In some embodiments, when the via layer 165 having a relatively low height (e.g., portions of the via layer 165 having a relatively low height to form recessed portions in the via layer 165) is formed, the pixel defining layer PDL may fill the via layer 165 having a relatively low height (e.g., fill recessed portions of the via layer 165 wherein the height of the via layer is relatively low) to compensate for a step of the corresponding area.

In this embodiment, the second data capping layer 143 formed together with the data conductive metal layer 141 by one mask process may prevent or reduce the occurrence of tips in the first data capping layer 142, and in the subsequent process, the first data capping layer 142 exposed by the second data capping layer 143 may be used as a contact electrode of the wiring pad WPD. Accordingly, the formation of tips in the data conductive layer 140 may be prevented or reduced, and thus the occurrence of cracks in a plurality of insulating layers on the data conductive layer 140 may be prevented or reduced. Further, because an additional mask process for forming a contact electrode of a separate wiring pad WPD is not required, process efficiency may be improved.

Hereinafter, some embodiments will be described. In the following embodiments, the same configuration as that previously described will be simplified or will not be repeated, and differences will be mainly described.

Figure 16:
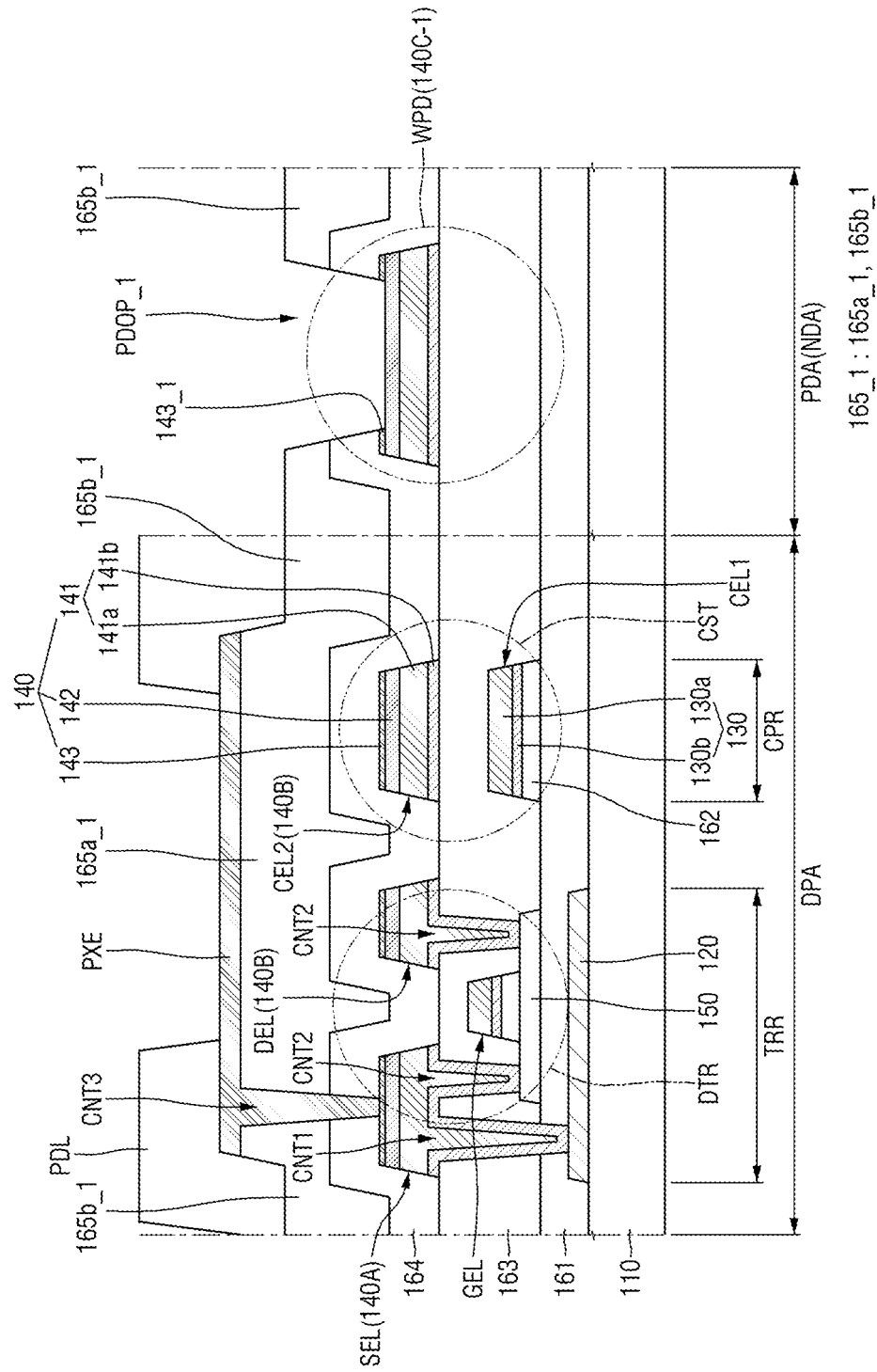
FIG. 16 is a cross-sectional view of a first display substrate of a display device according to an embodiment.

FIG. 16 is a cross-sectional view of a first display substrate of a display device according to an embodiment.

Referring to FIG. 16, the present embodiment is different from the embodiment of FIG. 5 in the laminated or cross-sectional structure of an insulating layer in the pad area PDA.

For example, in the present embodiment, a via layer 165_1 may include a step. The via layer 165_1 may include a stepped structure having a different height for each region. The via layer 165_1 may include a first region 165a_1 having a first height and a second region 165b_1 having a second height lower than the first height. The height of the via layer 165_1 may be measured from a reference plane such as one surface of the first substrate 110. For example, the height of the via layer 165_1 may mean a distance between the upper surface of the first substrate 110 and the upper surface of the via layer 165_1. The via layer 165_1 may have a substantially flat surface (e.g., a substantially flat upper surface in each region) regardless of the shape or presence of an underlying pattern in each region. At the boundary of each region, the via layer 165_1 may have a stepped structure (e.g., a change in height).

Parts of the first region 165a_1 and the second region 165b_1 of the via layer 165_1 are in the display area DPA. The first region 165a_1 of the via layer 1651 may overlap the overlying pixel electrode PXE. At least a part of the second region 165b_1 of the via layer 165_1 may be located in the non-light emitting area NEM in the display area DPA, and may not overlap the pixel electrode PXE. The second region 165b_1 of the via layer 165_1 may be along the periphery (e.g., at the boundaries) of the pixel electrode PXE, and may form a lattice-shaped puddle in the display area DPA. The other part of the second region 165b_1 of the via layer 165_1 is located in the pad area PDA of the non-display area NDA.

The via layer 165_1 may form a pad opening PDOP_1 exposing the third region 140C_1 of the data conductive layer 140 in the pad area PDA and exposing the passivation layer 164. The passivation layer 164 and the via layer 165_1 constituting the inner wall of the pad opening PDOP_1 may be aligned with each other, but the present disclosure is not limited thereto. The inner wall of the pad opening PDOP_1 may overlap the third region 140C_1 of the data conductive layer 140. However, the present disclosure is not limited thereto. The passivation layer 164 and the via layer 165_1 constituting the inner wall of the pad opening PDOP_1 may be aligned with the sidewall (e.g., the inner sidewall) of the second data capping layer 143_1 in the third region 140C_1 of the data conductive layer 140. Therefore, the upper surface of the second data capping layer 143_1 in the third region 140C_1 of the data conductive layer 140 may be covered by the passivation layer 164.

Figure 17:
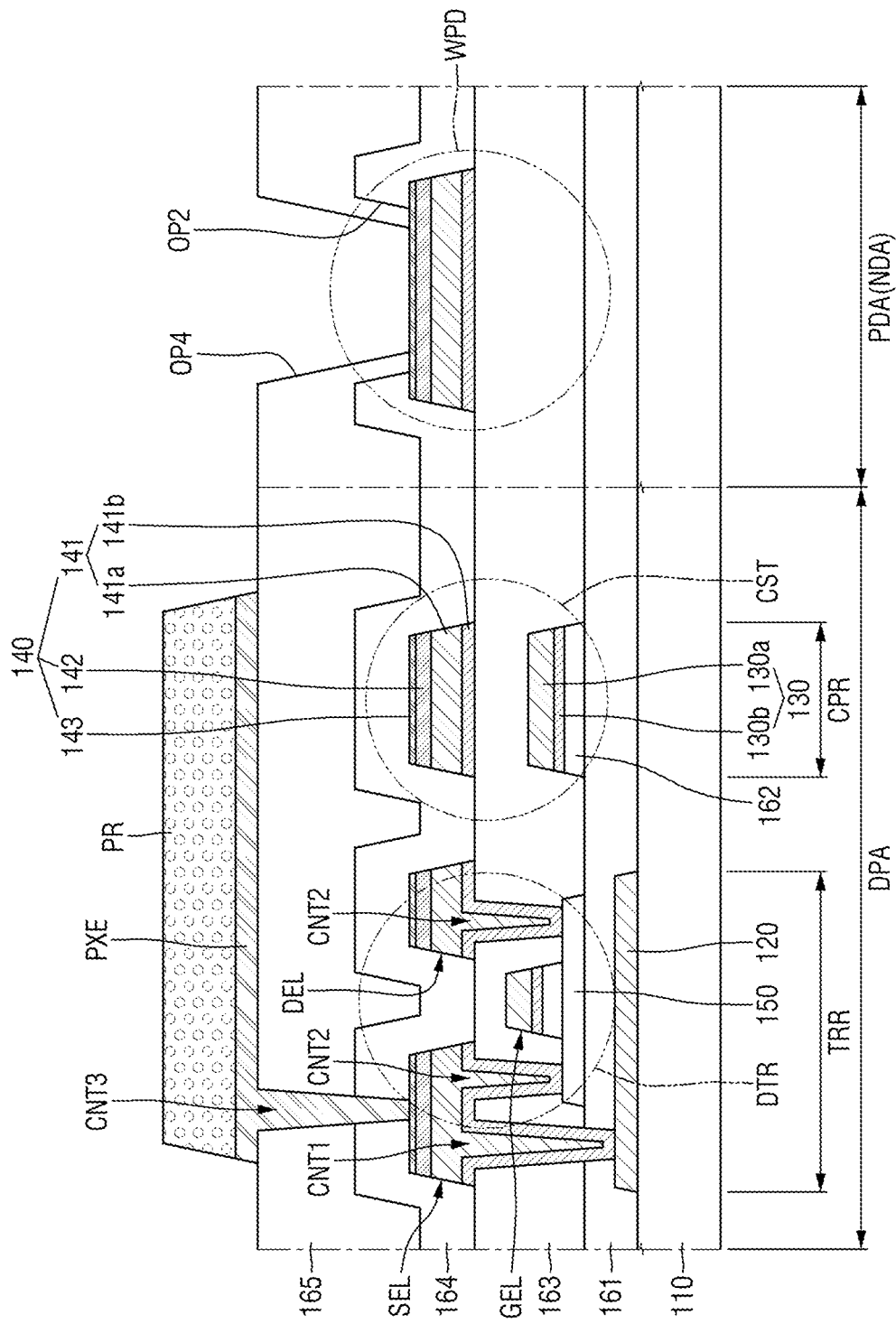
FIGS. 17 and 18 are cross-sectional views illustrating process steps of a method of manufacturing the display device of FIG. 16 according to an embodiment.
Figure 18:
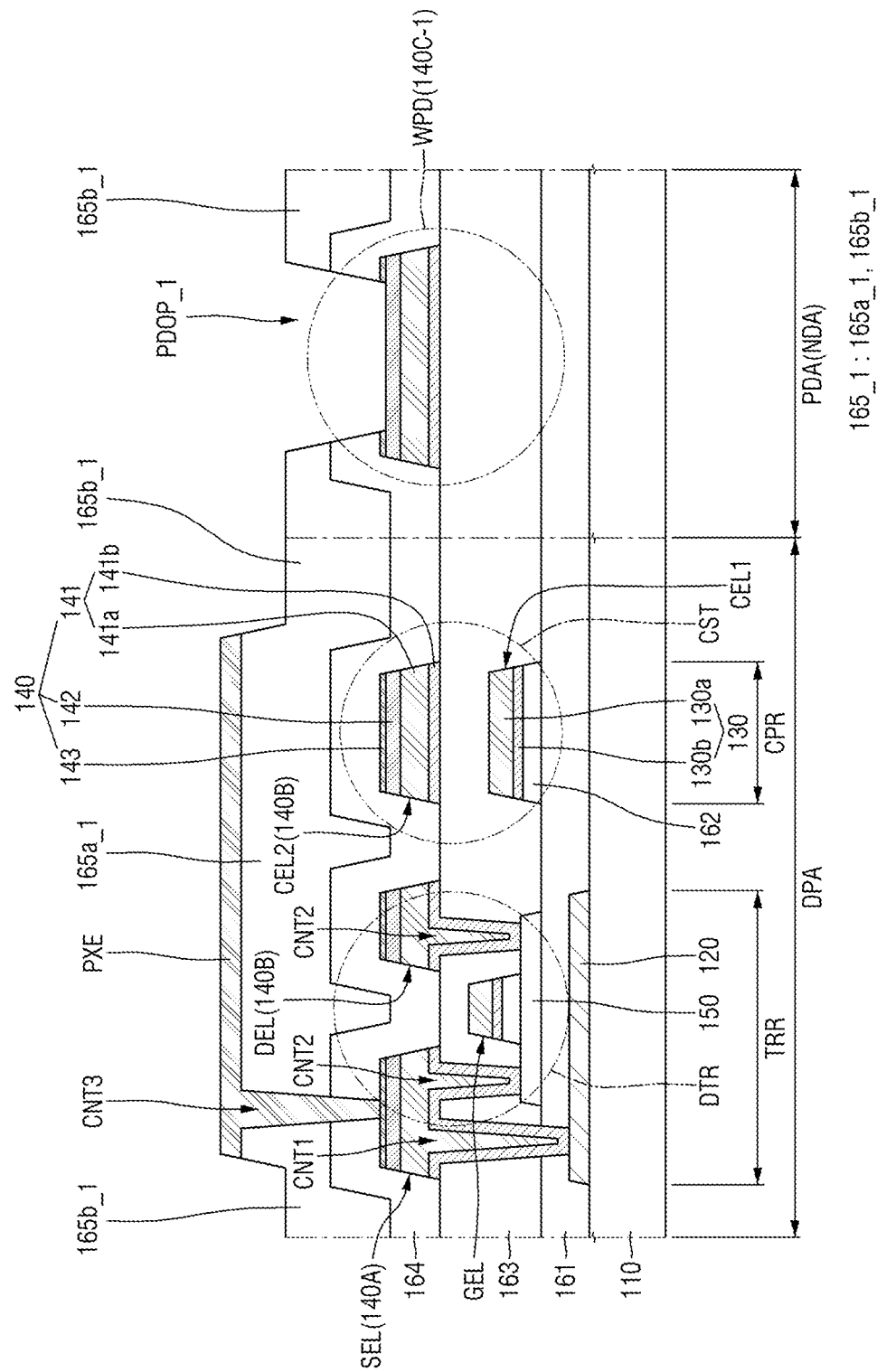

FIGS. 17 and 18 are cross-sectional views illustrating process steps of a method of manufacturing the display device of FIG. 16 according to an embodiment.

Processes for forming the patterned lower metal layer 120, the buffer layer 161, the semiconductor layer 150, the patterned gate insulating film 162, the gate conductive layer 130, the interlay insulating film 163 provided with the first contact hole CNT1 and the second contact hole CNT2, the patterned data conductive layer 140, the passivation layer 164, and the via layer 165 on the first substrate 110, entirely applying a material layer for a pixel electrode (e.g., applying a material layer for a pixel electrode over the entire via layer 165 and the exposed portions of the data conductive layer 140), and then forming a photoresist pattern PR on the material layer for the pixel electrode are the same as those described with reference to the embodiment of FIGS. 6 to 13.

For example, the material layer for the pixel electrode is etched using the photoresist pattern PR formed on the material layer for the pixel electrode as an etching mask. Referring to FIG. 17, after the process of etching the material layer of the pixel electrode, the second data capping layer 143 of the data conductive layer 140 in the pad area PDA may partially remain without being etched, and may thus be on the first data capping layer 142.

Subsequently, referring to FIG. 18, the photoresist pattern PR is removed through an ashing process in a state (e.g., during a process) where the photoresist pattern PR on the pixel electrode PXE remains, and in this process, the second data capping layer 143 (e.g., the portion of the second data capping layer 143) of the data conductive layer 140 in the pad are PDA, exposed by the fourth opening OP4, may be removed. For example, when the second data capping layer 143 includes copper (Cu), the copper (Cu) may be corroded by the ashing process, and, as described above, oxides produced by the corrosion of copper (Cu) may be removed by the ashing process because the second data capping layer 143 is relatively thin. In this process, the photoresist pattern PR remaining on the pixel electrode PXE is removed, and at least a part of the via layer 165_1 on which the photoresist pattern PR is not located is etched to form a via layer 165_1 having a step. Further, at least a part of the via layer 165_1 covering the side surface of the passivation layer 164 in the pad are PDA is etched, so that the side surfaces of the passivation layer 164 and the via layer 165_1 in the pad area PDA may be aligned in parallel (e.g., substantially in parallel).

Figure 19:
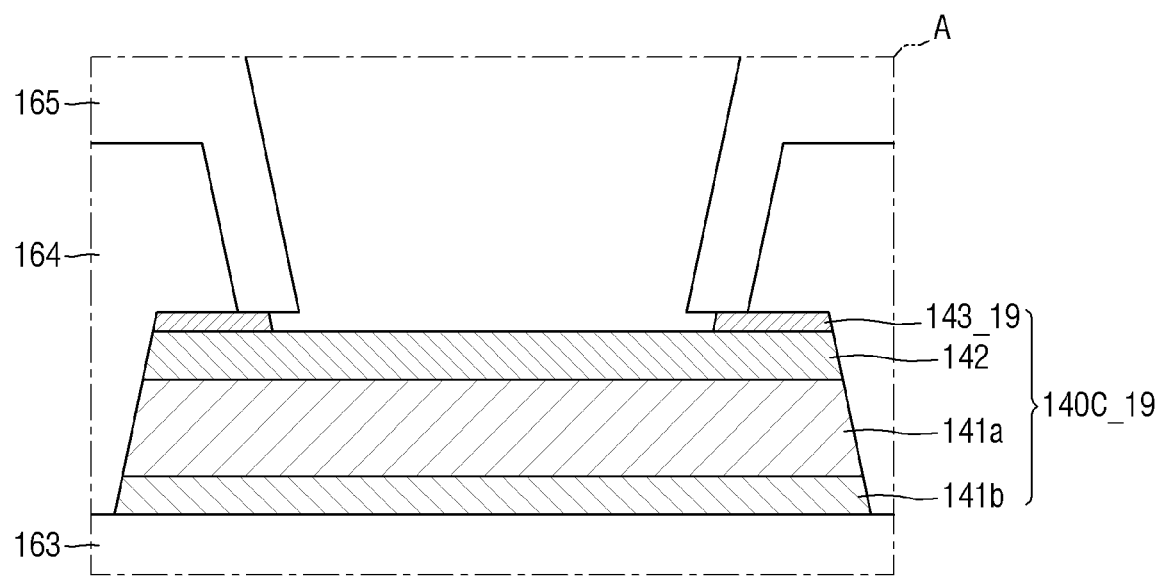
FIG. 19 is an enlarged view of the portion A in FIG. 5 according to an embodiment.

FIG. 19 is another enlarged view of the portion A in FIG. 5 according to an embodiment.

FIG. 19 shows a third region of the data conductive layer in the pad area PDA according to an embodiment. Referring to FIG. 19, the present embodiment is different from the embodiment of FIG. 5 in that the side surface (e.g., the inner side walls) of a second data capping layer 143_19 in a third region 140C_19 of the data conductive layer 14019 in the pad area PDA is not aligned with the side surface of the via layer 165.

For example, a part of the via layer 165 on the second data capping layer 143_19 in the third region 140C_19 of the data conductive layer 140_19 may cover the upper surface of the second data capping layer 143_19, and the other part thereof may protrude outward from the second data capping layer 143_19 (e.g., may protrude inward toward the center of the pad opening PDOP). Accordingly, at least a part of the lower surface of the via layer 165 protruding outward from the second data capping layer 143_19 may face the upper surface of the first data capping layer 142 (e.g., may face the upper surface of the first data capping layer 142 without the second data capping layer 143_19 therebetween) in an area overlapping the first data capping layer 142.

In the present embodiment, in the etching process for forming the pixel electrode PXE, the pixel electrode PXE may be formed when (e.g., during the same process as when) the material layer for the pixel electrode, located in the pad are PDA, is etched and exposed to an etchant used in (e.g., used during the same process for) etching the second data capping layer 143_19 of the data conductive layer 140_19 in the pad area PDA. For example, in some embodiments, during a process for forming the pixel electrode PXE, the material layer for the pixel electrode may be etched in both the display area DPA and in the pad area PDA, and a portion of the data capping layer 143_19 of the data conductive layer 140_19 in the pad area PDA may be etched. In an exemplary embodiment, when the second data capping layer 143_19 contains (e.g., includes) copper (Cu) having a relatively high selectivity, the second data capping layer 14319 may be etched to the inner side (e.g., to form inner side walls of the second data capping layer 143_19) from the side surface of the via layer 165 (e.g., toward the outer sidewalls of the second data capping layer 143_19) on the data conductive layer 140_19 in the pad area PDA, when (e.g., during the same process as when) the material layer for the pixel electrode and the second data capping layer 143_19 are etched. Although it is shown in FIG. 19 that at least a part of the lower surface of the via layer 165 may be exposed by the second data capping layer 143_19 (e.g., at least a part of the lower surface of the via layer 165 may face the upper surface of the first data capping layer 142 without the second data capping layer 14319 therebetween) on the first data capping layer 142, the present disclosure is not limited thereto. In this case, because the material included in the second data capping layer 143_19 has a relatively high selectivity, the second data capping layer 143_19 may expose the entire lower surface of the via layer 165 overlapping the data conductive layer 140_19 (e.g., the entire lower surface of the via layer 165 overlapping the data conductive layer 14019 without the passivation layer 164 therebetween), and may extend inward (e.g., toward the outer sides of the second data capping layer 143_19) to expose at least a part of the lower surface of the passivation layer 164.

Figure 20:
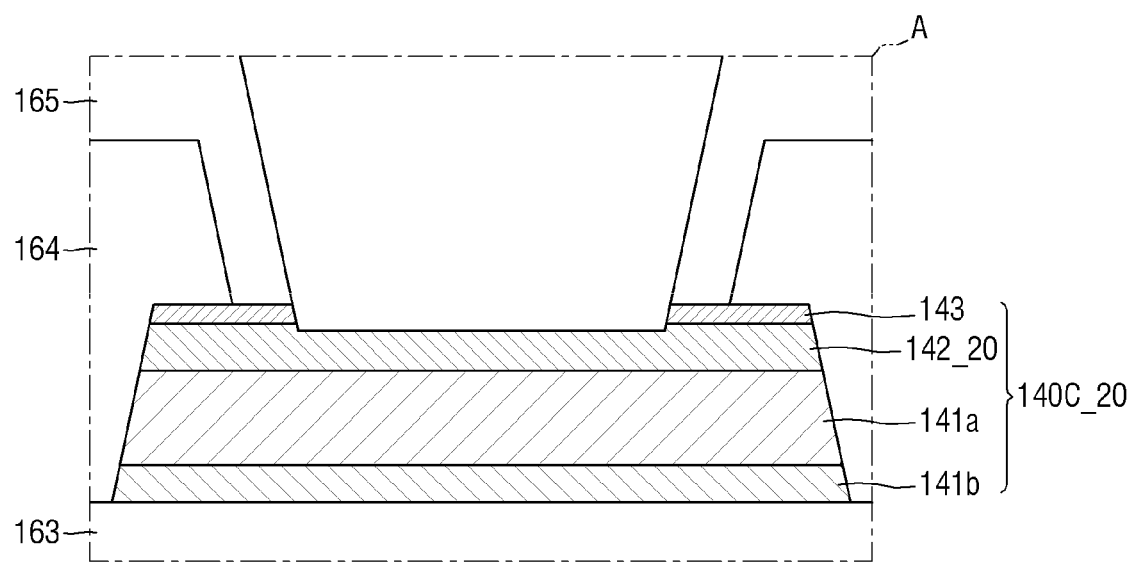
FIG. 20 is an enlarged view of the portion A in FIG. 5 according to an embodiment.

FIG. 20 is still another enlarged view of the portion A in FIG. 5 according to an embodiment.

FIG. 20 shows a third region of the data conductive layer in the pad area PDA according to an embodiment. Referring to FIG. 20, the present embodiment is different from the embodiment of FIG. 5 in that a first data capping layer 142_20 in a third region 140C_20 of the data conductive layer 140_20, located in the pad area PDA, may have surface steps having different thicknesses.

For example, in the present embodiment, the first data capping layer 14220 in the third region 140C_20 of the data conductive layer 140_20 may include a first section of the first data capping layer 142_20 located in a region overlapping the passivation layer 164 and the via layer 165, and a second section having a smaller thickness (e.g., a lower height) than that of the first section of the first data capping layer 142_20. The second section of the first data capping layer 142_20 in the third region 140C_20 of the data conductive layer 14020 may be located in the region exposed by the pad opening PDOP. Accordingly, the side surfaces of the via layer 165; the second data capping layer 143; and the first data capping layer 14220 (e.g., the inner side walls of the first section of the first data capping layer 142_20 at the border between the first and second sections of the first data capping layer 142_20), aligned in parallel (e.g., substantially in parallel) with the second data capping layer 143 (e.g., the inner side walls of the second data capping layer 143), may be aligned with each other to form a pad opening PDOP in the pad area PDA.

In the present embodiment, in the etching process for forming the pixel electrode PXE, the pixel electrode PXE may be formed when (e.g., during the same process as when) the material layer for the pixel electrode, located in the pad are PDA, and the second data capping layer 143 on the entire surface of the first data capping layer 142_20 are etched and exposed to an etchant used in (e.g., used during the same process for) etching the second data capping layer 143. In an exemplary embodiment, when the material layer for the pixel electrode and the second data capping layer 143 are etched, at least a part of the first data capping layer 142_20 may also be etched. However, when the first data capping layer 142_20 is formed of a material containing (e.g., including) titanium (Ti) having a relatively low selectivity and the first data capping layer 142_20 has a sufficient thickness (e.g., as shown in FIG. 20), only a part of the first data capping layer 14220 may be etched. Even in this case, the first data capping layer 142_20 (e.g., a portion of the first data capping layer 142_20, such as the second section of the first data capping layer 142_20) on the data main metal layer 141a may remain to cover and protect the upper surface of the data main metal layer 141a.

Figure 21:
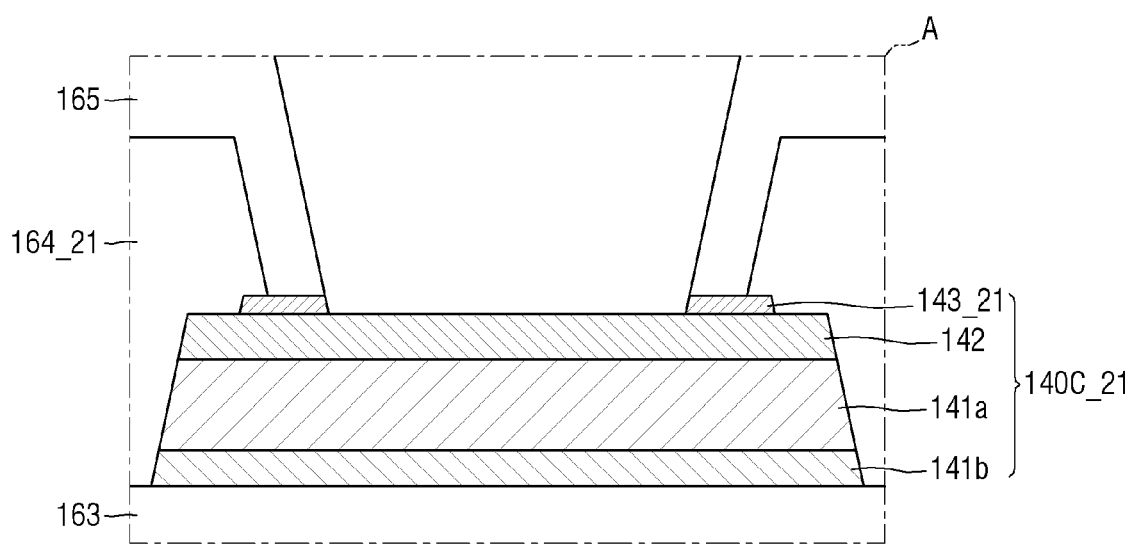
FIG. 21 is an enlarged view of the portion A in FIG. 5 according to an embodiment.

FIG. 21 is still another enlarged view of the portion A in FIG. 5 according to an embodiment.

FIG. 21 shows a third region of the data conductive layer in the pad area PDA. Referring to FIG. 21, the present embodiment is different from the embodiment of FIG. 5 in that a second data capping layer 143_21 in a third region 140C_21 of the data conductive layer 140_21, located in the pad area PDA, exposes at least a part of the upper surface of the first data capping layer 142 (e.g., exposes at least a part of the upper surface of the first data capping layer 142 to the lower surface of the passivation layer 164_21), located under the second data capping layer 143_21. For example, the outer side walls of the second data capping layer 14321 may recede away from (e.g., toward the center of the pad opening PDOP), and not be aligned with, the outer side walls of the first data capping layer 142 so that a portion of the upper surface of the first data capping layer 142 at (e.g., near) the outer sides of the first data capping layer 142 is exposed to (e.g., in direct or physical contact with) the lower surface of the passivation layer 164_21.

For example, the second data capping layer 143_21 in the third region 140C_21 of the data conductive layer 140_21 may be on the first data capping layer 142. The lower surface of the second data capping layer 143_21 may be in direct contact with the upper surface of the first data capping layer 142. The second data capping layer 143_21 may not be in at least a part of an area where the first data capping layer 142 and the passivation layer 16421 overlap each other. Accordingly, the upper surface of the first data capping layer 142 exposed by the second data capping layer 143_21 may be in direct contact with the passivation layer 164_21.

In the present embodiment, in the process of forming a pattern of a data conductive layer, the pattern of the data conductive layer may be formed when sequentially laminated material layers of the data conductive layer have different selectivities. For example, when the material included in the material layer for the second data capping layer has a higher selectivity for an etchant than the material included in the material layer for the data main metal layer, the etching rate of the material layer for the second data capping layer may be faster than that of the material layer for the data main metal layer. In this case, because the material layer for the second data capping layer is etched faster than the material layer for the data main metal layer (e.g., as shown in FIG. 21) the outer surface (e.g., outer side walls) of the second data capping layer 143_21 may be aligned inward from the side surface (e.g., outer side walls) of the data main metal layer 141a. For example, the outer side walls of the second data capping layer 143_21 may be closer toward the center of the pad opening PDOP than the outer side walls of the data main metal layer 141a so that the outer side walls of the second data capping layer 143_21 are not aligned with those of the data main metal layer 141a. Even in this case, because the material included in the second data capping layer 143_21 has a higher selectivity than the material included in the data main metal layer 141a, in the etching process for forming the pattern of the data conductive layer 140_21, the occurrence of tips in the first data capping layer 142 under the second data capping layer 143_21 may be prevented or reduced.

Figure 22:
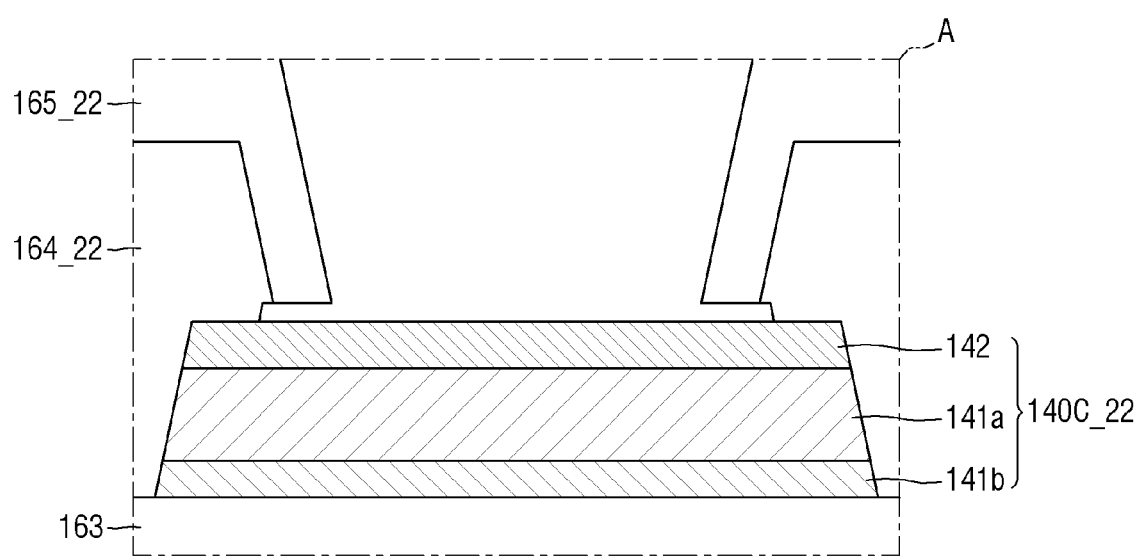
FIG. 22 is an enlarged view of the portion A in FIG. 5 according to an embodiment.
Figure 23:
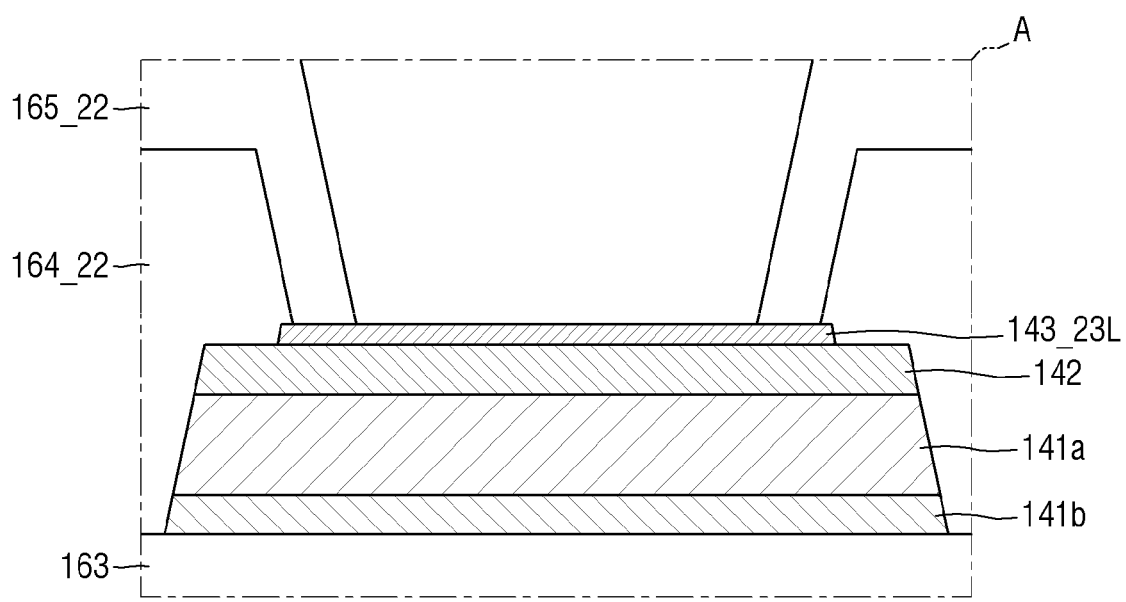
FIG. 23 is an enlarged view of the portion A in FIG. 5 for explaining the processes of a method of manufacturing the display device of FIG. 22 according to an embodiment.

FIG. 22 is still another enlarged view of the portion A in FIG. 5 according to an embodiment, and FIG. 23 is an enlarged view for explaining the processes of a method of manufacturing the display device of FIG. 22 according to an embodiment.

FIG. 22 shows a third region of the data conductive layer in the pad area PDA according to an embodiment. Referring to FIG. 22, the present embodiment is different from the embodiment of FIG. 5 in that a third region 140C_22 of the data conductive layer 140_22 in the pad area PDA does not include the second data capping layer.

For example, the second data capping layer may not be on the first data capping layer 142 in the third region 140C_22 of the data conductive layer 140_22. Similar to the embodiment of FIG. 21, a passivation layer 164_22 may be on (e.g., directly on) at least a part of the upper surface of the first data capping layer 142. Accordingly, the upper surface (e.g., a portion of the upper surface) of the first data capping layer 142 located in a region of the first data capping layer 142 where the passivation layer 164_22 is not on may be exposed. A space may be formed between the via layer 165_22 (e.g., a portion of the via layer 165_22 wherein the passivation layer 164_22 is not between the via layer 165_22 and the first data capping layer 142) and the first data capping layer 142 near the sidewall of the pad opening PDOP in the thickness direction.

In the present embodiment, in the process of forming a pattern of a data conductive layer, the pattern of the data conductive layer may be formed when sequentially laminated material layers of the data conductive layer have different selectivities. For example, referring to FIG. 23, when the material included in the material layer for the second data capping layer has a higher selectivity for an etchant than the material included in the material layer for the data main metal layer, the etching rate of the material layer for the second data capping layer may be faster than that of the material layer for the data main metal layer. In this case, because the material layer for the second data capping layer is etched faster than the material layer for the data main metal layer (e.g., as shown in FIG. 23), the side surface (e.g., the outer side walls) of the material layer 143_23L for the second data capping layer formed during the etching process of the data conductive layer may be aligned inward from the side surface (e.g., the outer side walls) of the data main metal layer 141a. For example, the outer side walls of the material layer 143_23L may be closer toward the center of the pad opening PDOP than the outer side walls of the data main metal layer 141a so that the outer side walls of the material layer 143_23L are not aligned with those of the data main metal layer 141a. Even in this case, as described above, because the material included in the material layer 143_23L for the second data capping layer has a higher selectivity than the material included in the data main metal layer 141a, in the etching process of forming the pattern of the data conductive layer, the occurrence of tips in the first data capping layer 142 under the material layer 143_23L for the second data capping layer may be prevented or reduced.

After the patterned data conductive layer of FIG. 23 is formed, a passivation layer 164_22, a via layer 164_22, and a pixel electrode PXE may be sequentially formed. In the etching process for forming a patterned pixel electrode PXE, the material layer 143_23L for the second data capping layer, exposed by the pad opening PDOP in the pad area PDA, may be entirely removed by an etchant.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A display device, comprising:
a substrate including a display area and a pad area;
a first conductive layer on the substrate;
a first insulating film on the first conductive layer; and
a second conductive layer on the first insulating film,
the first conductive layer including a base layer, a main metal layer on the base layer and including copper, a first conductive capping layer on the main metal layer, and a second conductive capping layer on the first conductive capping layer,
the first insulating film having a first contact hole in the display area and penetrating through the first insulating film in a thickness direction to expose the first conductive layer and a pad opening exposing the first conductive layer in the pad area,
the first conductive layer being arranged such that:
in a first region covered by the first insulating film, the second conductive capping layer is entirely on the first conductive capping layer;
in a second region overlapping the first contact hole, the second conductive capping layer is entirely on the first conductive capping layer; and
in a third region exposed by the pad opening, the second conductive capping layer exposes at least a portion of the first conductive capping layer.

2. The display device of claim 1, wherein the second conductive capping layer includes Cu or ZIO.

3. The display device of claim 2, wherein the first conductive capping layer includes a different material from the main metal layer.

4. The display device of claim 3, wherein the first conductive capping layer includes Ti.

5. The display device of claim 2, wherein the base layer and the first conductive capping layer include the same material.

6. The display device of claim 5, wherein side surfaces of the base layer, the main metal layer, the first conductive capping layer, and the second conductive capping layer of the first conductive layer are aligned in parallel with each other.

7. The display device of claim 2, further comprising:
a third conductive layer on the substrate and under the first conductive layer in the first region; and a second insulating film between the third conductive layer and the first conductive layer.

8. The display device of claim 7, wherein the second insulating film includes a second contact hole in the display area and penetrating through the second insulating film in the thickness direction to expose the third conductive layer.

9. The display device of claim 8, wherein the first conductive layer in the first region is connected to the third conductive layer through the second contact hole included in the second insulating film.

10. The display device of claim 1, wherein the second conductive capping layer includes the same material as the main metal layer.

11. The display device of claim 10, wherein the first conductive capping layer and the base layer include the same material.

12. The display device of claim 11, wherein the first conductive capping layer and the base layer include Ti.

13. The display device of claim 1, wherein the first conductive layer is connected to the second conductive layer through the first contact hole in the second region.

14. The display device of claim 1, wherein the first conductive capping layer of the first conductive layer is exposed by the pad opening in the third region.

15. The display device of claim 14, wherein the second conductive capping layer of the first conductive layer does not overlap the pad opening in the thickness direction in the third region.

16. A display device, comprising:
a substrate including a display area and a pad area;
a first conductive layer on the substrate;
a first insulating film on the first conductive layer; and
a second conductive layer on the first insulating film,
the first conductive layer including a base layer, a main metal layer on the base layer, a first conductive capping layer on the main metal layer, and a second conductive capping layer on the first conductive capping layer,
the first insulating film having a first contact hole in the display area and penetrating through the first insulating film in a thickness direction to expose the first conductive layer, and a pad opening exposing the first conductive layer in the pad area,
the first conductive layer including a first region overlapping the first contact hole, a second region covered by the first insulating film, and a third region exposed by the pad opening, and
the first region of the first conductive layer and the second region of the first conductive layer overlapping the display area, and the third region of the first conductive layer overlapping the pad area.

17. The display device of claim 16,
wherein the main metal layer and the second conductive capping layer include the same material, and
wherein the base layer and the first conductive capping layer include the same material.

18. The display device of claim 17, wherein the main metal layer and the first conductive capping layer include different materials.

19. The display device of claim 18, wherein, in the third region of the first conductive layer, the first conductive capping layer is exposed in the thickness direction by the second conductive capping layer, and the first conductive capping layer exposed by the second conductive capping layer overlaps the pad opening in the thickness direction.

20. The display device of claim 16, wherein the second conductive layer is connected to the second region of the first conductive layer through the first contact hole.

* * * * *